United States Patent
Choi et al.

(10) Patent No.: US 12,484,415 B2
(45) Date of Patent: Nov. 25, 2025

(54) LIGHT EMITTING DISPLAY DEVICE AND METHOD OF MANUFACTURING THE SAME

(71) Applicant: LG Display Co., Ltd., Seoul (KR)

(72) Inventors: HanSol Choi, Paju-si (KR); SangHoon Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 442 days.

(21) Appl. No.: 18/076,862

(22) Filed: Dec. 7, 2022

(65) Prior Publication Data

US 2023/0207735 A1 Jun. 29, 2023

(30) Foreign Application Priority Data

Dec. 28, 2021 (KR) ........................ 10-2021-0189822

(51) Int. Cl.
*H10K 59/131* (2023.01)
*H10H 29/49* (2025.01)
*H10K 59/80* (2023.01)

(52) U.S. Cl.
CPC ... *H10K 59/80522* (2023.02); *H10K 59/1315* (2023.02); *H10H 29/49* (2025.01)

(58) Field of Classification Search
CPC ...... H10K 59/12; H10K 59/131; H10K 59/82; H10K 59/1315; H10K 59/80522; H10K 59/124; H10K 59/122; H10K 59/173; H10K 50/824; H10H 20/0364; H10H 20/857; H10H 29/0364; H10H 29/49; H10H 29/857; H10H 29/41; H10H 29/37
See application file for complete search history.

(56) References Cited

U.S. PATENT DOCUMENTS

| | | |
|---|---|---|
| 2015/0009105 A1 | 1/2015 | Nomura |
| 2015/0179719 A1 | 6/2015 | Nam et al. |
| 2017/0125495 A1 | 5/2017 | Lee et al. |
| 2017/0194415 A1 | 7/2017 | Choi et al. |
| 2018/0120620 A1* | 5/2018 | Shim .................. H10K 59/1315 |
| 2018/0151647 A1 | 5/2018 | Lee et al. |
| 2018/0190934 A1 | 7/2018 | Choi et al. |
| 2020/0203469 A1 | 6/2020 | Li et al. |
| 2021/0202655 A1* | 7/2021 | Cho ..................... H10K 59/124 |

(Continued)

FOREIGN PATENT DOCUMENTS

| | | |
|---|---|---|
| CN | 111211243 A | 5/2020 |
| EP | 3026724 A1 | 6/2016 |
| EP | 3316311 A1 | 5/2018 |

(Continued)

OTHER PUBLICATIONS

Extended European Search Report for Application No. 22212211.1, dated May 30, 2023, 7 pages.

*Primary Examiner* — Yu Chen
(74) *Attorney, Agent, or Firm* — Morgan, Lewis & Bockius LLP

(57) ABSTRACT

A light emitting display device may include a circuit layer having an auxiliary power electrode disposed on a substrate, a protective layer covering the circuit layer, a contact portion exposing a portion of the auxiliary power electrode, and an undercut structure disposed on a portion of the auxiliary power electrode and configured to include an undercut region. The undercut region may be formed at at least a portion of the periphery of the undercut structure.

17 Claims, 18 Drawing Sheets

(56) References Cited

U.S. PATENT DOCUMENTS

2021/0202882 A1  7/2021  Shim et al.

FOREIGN PATENT DOCUMENTS

| EP | 3503238 A1 | 6/2019 |
| EP | 3920233 A1 | 12/2021 |
| JP | 2017-120771 A | 7/2017 |
| JP | 2018-92168 A | 6/2018 |
| JP | 2018-109758 A | 7/2018 |
| KR | 10-2021-0068831 A | 6/2021 |
| KR | 10-2021-0082908 A | 7/2021 |
| TW | 201834236 A | 9/2018 |

* cited by examiner

LIGHT EMITTING DISPLAY DEVICE AND METHOD OF MANUFACTURING THE SAME

CROSS-REFERENCE TO RELATED APPLICATION

This application claims the benefit of and priority to Korean Patent Application No. 10-2021-0189822, filed on Dec. 28, 2021, the entirety of which is incorporated herein by reference for all purposes as if fully set forth herein.

BACKGROUND

1. Technical Field

The present disclosure relates to apparatuses and methods and particularly to, for example, without limitation, a light emitting display device and a method of manufacturing the same.

2. Discussion of the Related Art

With the advancement of an information-oriented society, attentions and requirements for a display device configured to display images have been increased in various types. Accordingly, a display device such as a liquid crystal display (LCD), an organic light emitting display (OLED), a micro light emitting diode (Micro LED), a quantum dot display device (QD), or the like may be utilized.

Among these display devices, a light emitting display device is classified into an inorganic light emitting display device and an organic light emitting display device depending on the material of a light emitting layer. For example, the organic light emitting display device is self-luminous, wherein holes and electrons are injected into a light emitting layer from an anode electrode for a hole injection and a cathode electrode for an electron injection, and light is emitted when excitons in which the injected holes and electrons are combined and fall from an excited state to a ground state, to thereby display an image.

The light emitting display device may be divided into a top emission type, a bottom emission type, or a dual emission type according to a direction in which light is emitted.

In case of the light emitting display device of the top emission type, a transparent electrode or a semi-transmissive electrode may be used as a cathode to emit light from the light emitting layer to an upper portion. The cathode electrode may have a thin profile (or thickness) to improve transmittance, thereby increasing an electrical resistance. Particularly, in case of the large-sized light emitting display device, a voltage drop may be more sever as the distance from a voltage supplying pad increases, whereby a luminance non-uniformity problem of the light emitting display device might occur.

In order to overcome the problem of voltage drop caused by the increase in resistance of the cathode electrode, a cathode contact structure having an undercut shape is proposed in the present disclosure to electrically connect a separate auxiliary electrode to the cathode electrode.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

In the case of a cathode contact structure, in order to increase a contact area between an auxiliary electrode and a cathode electrode, a structure forming an undercut may be formed in an island shape and an undercut region may be formed throughout the entire edge of the structure. However, when the cathode electrode is in a floating state at the undercut structure, a bursting phenomenon may occur during an aging process due to static electricity inherent therein.

The inventors of the present disclosure have recognized the problems and disadvantages of the related art, have performed extensive research and experiments, and developed a new invention to provide a light emitting display device capable of uniformly increasing a cathode contact area and preventing a bursting phenomenon from occurring in the cathode contact area. Accordingly, embodiments of the present disclosure are directed to apparatuses and methods that substantially obviate one or more problems due to limitations and disadvantages of the related art.

To achieve these and other advantages and aspects of the present disclosure, as embodied and broadly described herein, in one or more aspects, a light emitting display device may comprise a circuit layer having an auxiliary power electrode disposed on a substrate, a protective layer covering the circuit layer, a contact portion exposing a portion of the auxiliary power electrode, and an undercut structure disposed on a portion of the auxiliary power electrode and configured to include an undercut region. The undercut region may be formed in at least a portion of the periphery of the undercut structure.

In accordance with one or more aspects of the present disclosure, there is provided a method of manufacturing a light emitting display device. The method may comprise forming a circuit layer having an auxiliary power electrode on a substrate, forming a protective layer of at least one of an organic insulating material and an inorganic insulating material so as to cover the circuit layer, and forming an undercut structure having an undercut region on a portion of the auxiliary power electrode so as to expose a portion of the auxiliary power electrode. The undercut region may be formed in at least a portion of the periphery of the undercut structure.

Other apparatuses, methods, features and advantages will be, or will become, apparent to one with skill in the art upon examination of the following figures and detailed description. It is intended that all such additional apparatuses, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles of the disclosure. In the drawings.

Figure 1:
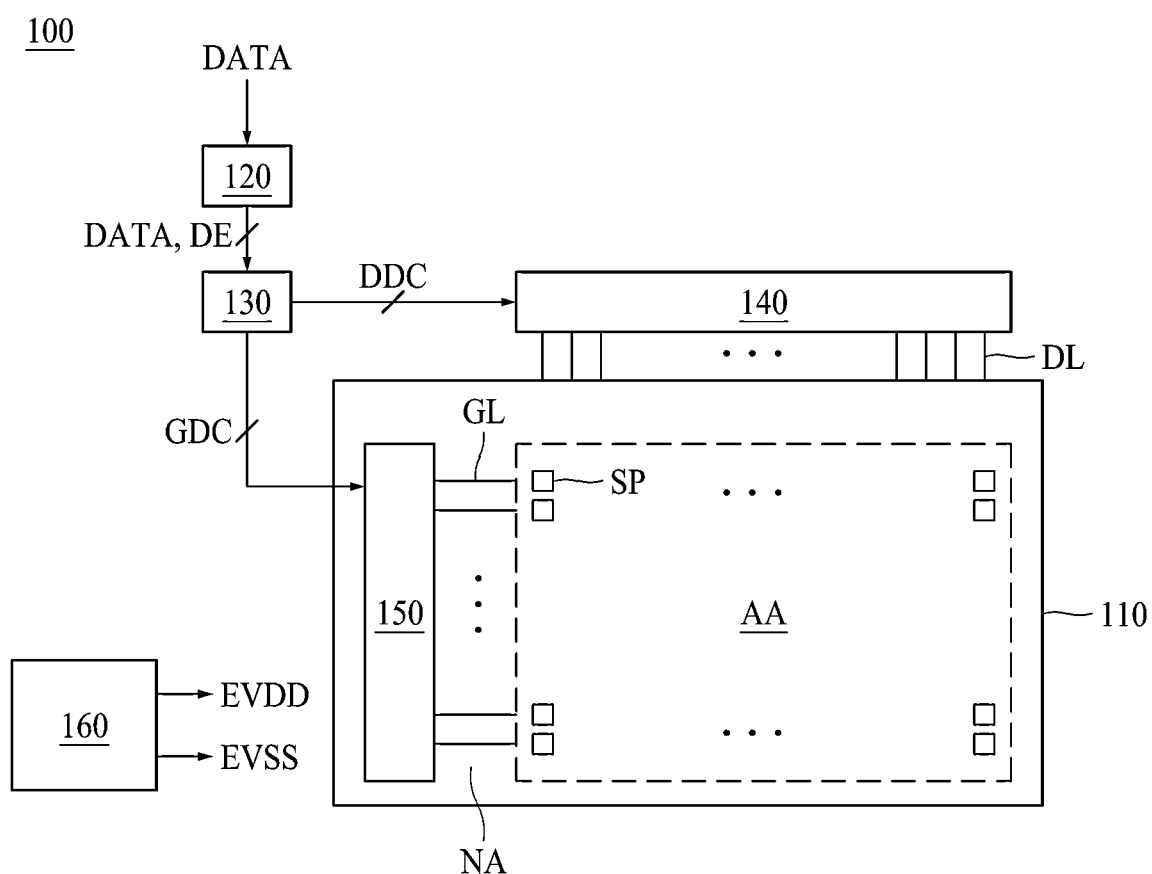
FIG. 1 is a block diagram schematically illustrating a light emitting display device according to the example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are provided so that this disclosure is thorough and complete and fully conveys the scope of the present disclosure to those skilled in the art. Furthermore, the present disclosure is only defined by claims and their equivalents.

The shapes, sizes, areas, ratios, angles, numbers, and the like disclosed in the drawings for describing embodiments of the present disclosure are merely examples, and thus, the present disclosure is not limited to the illustrated details.

When the term "comprise," "have," "include," "contain," "constitute," "make up of," "formed of," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. Any implementation described herein as an "example" is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term "may" encompasses all the meanings of the term "can."

In describing a positional relationship, where the positional relationship between two parts is described, for example, using "on," "over," "under," "above," "below," "beneath," "near," "close to," or "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent,"

"next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

Hereinafter, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. In addition, for convenience of description, a scale, dimension, size, and thickness of each of the elements illustrated in the accompanying drawings may differ from an actual scale, dimension, size, and thickness, and thus, embodiments of the present disclosure are not limited to a scale, dimension, size, and thickness illustrated in the drawings.

FIG. 1 is a block diagram schematically illustrating a light emitting display device according to one example embodiment of the present disclosure.

Referring to FIG. 1, the light emitting display device 100 according to one example embodiment of the present disclosure may include a display panel 110, an image processor 120, a timing controller 130, a data driver 140, a scan driver 150, and a power supply 160.

The display panel 110 may display an image corresponding to a data signal DATA supplied from the data driver 140, a scan signal supplied from the scan driver 150, and power supplied from the power supply 160.

The display panel 110 may include a sub pixel SP disposed at every intersection of a plurality of gate lines GL and a plurality of data lines DL. A structure of the sub pixel SP may vary depending on the type of the light emitting display device 100.

For example, the sub pixels SP may be formed in a top emission method, a bottom emission method, or a dual emission method according to the structure. The sub pixels SP may include a red sub pixel, a green sub pixel, and a blue sub pixel. Alternatively, the sub pixel SP may include a red sub pixel, a blue sub pixel, a white sub pixel, and a green sub pixel. The sub pixels SP may have one or more other light emitting areas according to light emitting characteristics.

The one or more sub pixels SP may constitute one unit pixel. For example, one unit pixel may include red, green, and blue sub pixels, and the red, green, and blue sub pixels may be repeatedly arranged. Alternatively, one unit pixel may include red, green, blue, and white subpixels, wherein the red, green, blue and white subpixels may be repeatedly arranged, or the red, green, blue and white subpixels may be arranged in a quad type. In the embodiment according to the present disclosure, the color type, arrangement type, arrangement order, etc. of the sub pixels may be configured in various forms depending on the luminous characteristics, the lifespan of the device, the spec of the device, and the like, whereby it is not limited thereto.

The display panel 110 may be divided into a display area AA for displaying an image by arranging the sub pixels SP, and a non-display area NA around the display area AA. The scan driver 150 may be provided on the non-display area NA of the display panel 110. In addition, the non-display area NA may include a pad area.

The image processor 120 may output a data enable signal DE together with the data signal DATA supplied from the outside. The image processor 120 may output one or more of a vertical synchronization signal, a horizontal synchronization signal, and a clock signal in addition to the data enable signal DE.

The timing controller 130 may receive the data signal DATA as well as a driving signal from the image processor 120. The driving signal may include the data enable signal DE. Alternatively, the driving signal may include a vertical synchronization signal, a horizontal synchronization signal, and a clock signal. The timing controller 130 may output a data timing control signal DDC for controlling the operation timing of the data driver 140, and a gate timing control signal GDC for controlling the operation timing of the scan driver 150 based on the driving signal.

The data driver 140 may convert the data signal DATA into a gamma reference voltage by sampling and latching the data signal DATA supplied from the timing controller 130 in response to the data timing control signal DDC supplied from the timing controller 130, and may output the gamma reference voltage.

The data driver 140 may output the data signal DATA through the data lines DL. The data driver 140 may be implemented in the form of an integrated circuit IC. For example, the data driver 140 may be electrically connected to the pad area disposed in the non-display area NA of the display panel 110 through a flexible circuit film.

The scan driver 150 may output the scan signal in response to the gate timing control signal GDC supplied from the timing controller 130. The scan driver 150 may output the scan signal through the gate lines GL. The scan driver 150 may be implemented in the form of an integrated circuit IC or may be implemented in a gate-in-panel GIP scheme.

The power supply 160 may output a high potential voltage and a low potential voltage for driving the display panel 110. The power supply 160 may supply a high potential voltage to the display panel 110 through a first power line EVDD (driving power line or pixel power line), and may supply a low potential voltage to the display panel 110 through a second power line EVSS (auxiliary power line or common power line).

Figure 2:
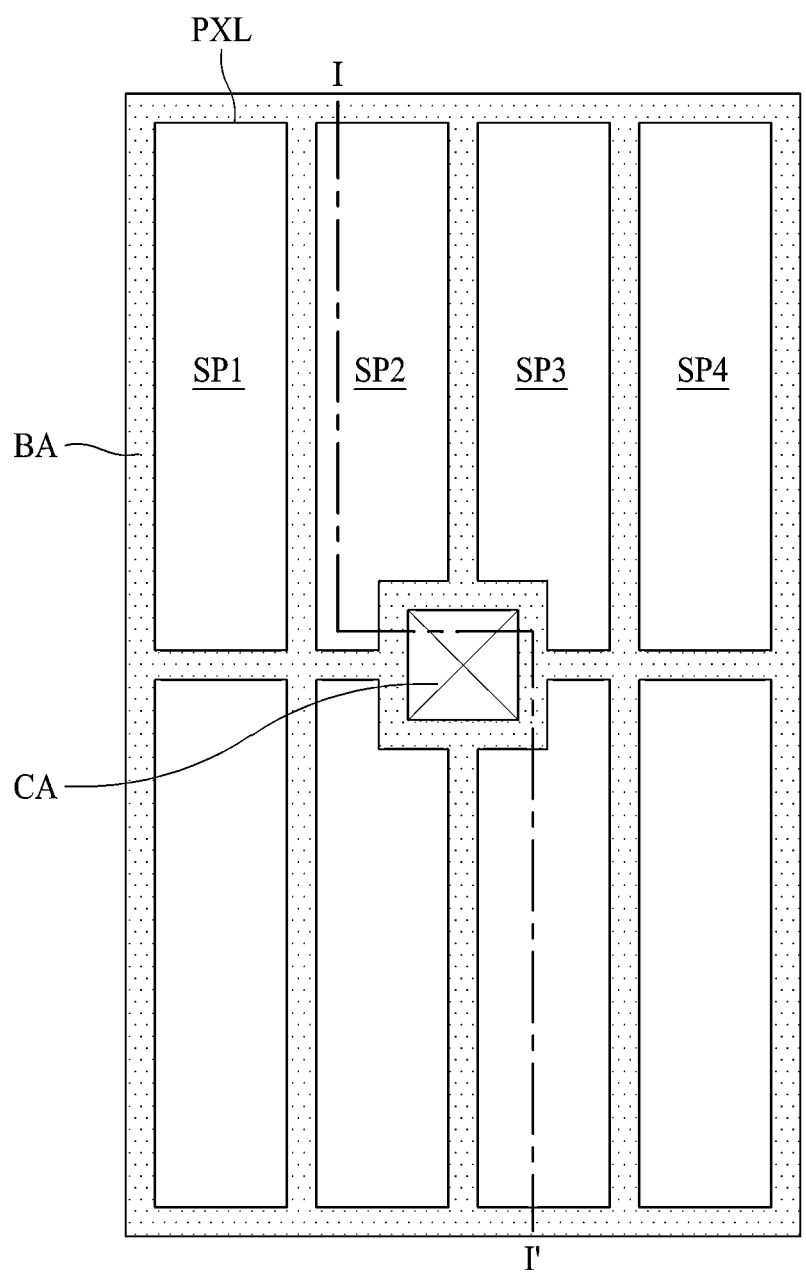
FIG. 2 schematically illustrates a first electrode, a bank and a contact portion of subpixels in the light emitting display device according to the example embodiment of the present disclosure.

FIG. 2 is a plan view schematically illustrating a first electrode, a bank layer, and a contact portion of sub pixels in the light emitting display device according to the example embodiment of the present disclosure.

Referring to FIG. 2 in connection with FIG. 1, the display panel 110 of the light emitting display device 100 according to the example embodiment of the present disclosure may be divided into the display area AA and the non-display area NA, and may include the plurality of sub pixels SP1, SP2, SP3, and SP4 defined by the intersection between the gate line GL and the data line DL on the substrate of the display area AA.

As shown in FIG. 2, the plurality of sub pixels SP1, SP2, SP3, and SP4 may include the first sub pixel SP1, the second sub pixel SP2, the third sub pixel SP3, and the fourth sub pixel SP4. For example, the first sub pixel SP1 may emit red light, the second sub pixel SP2 may emit green light, the third sub pixel SP3 may emit blue light, and the fourth sub pixel SP4 may emit white light, but not necessarily. It is possible to omit the fourth sub pixel SP4 for emitting white light. It is possible to configure the sub pixels emitting at least two of red light, green light, blue light, yellow light, magenta light, and cyan light. Furthermore, the arrangement order of the sub pixels SP1, SP2, SP3, and SP4 may be variously changed.

A pixel electrode PXL (or anode electrode or first electrode) may be disposed in each of the plurality of sub pixels SP1, SP2, SP3, and SP4. A bank layer BA covering (or overlaying) an edge portion of the pixel electrode PXL and defining an opening corresponding to the plurality of sub pixels SP1, SP2, SP3, and SP4 may be disposed on the pixel electrode PXL. Further, a light emitting layer (or organic light emitting layer) and a common electrode (or cathode electrode or second electrode) may be sequentially stacked on the pixel electrode PXL and the bank layer BA.

According to the example embodiment of the present disclosure, in order to lower the resistance of the common electrode provided over the entire surface of the display panel 110, a separate auxiliary power electrode may be formed of a material having a lower resistance than the common electrode and electrically connected to the common electrode. The bank layer BA may define a contact portion CA that exposes a portion of the auxiliary power electrode so as to electrically connect the auxiliary power electrode and the common electrode with each other.

The contact portion CA may be formed for each of the four sub pixels SP1, SP2, SP3, and SP4 constituting one unit pixel while being parallel to the gate line GL, however, it is not limited to this structure. The contact portion CA may be formed every several sub pixels. In addition, the contact portion CA may be formed by each horizontal line in a direction parallel to the data line DL, but is not limited thereto, and may be formed every several horizontal lines.

Figure 3:
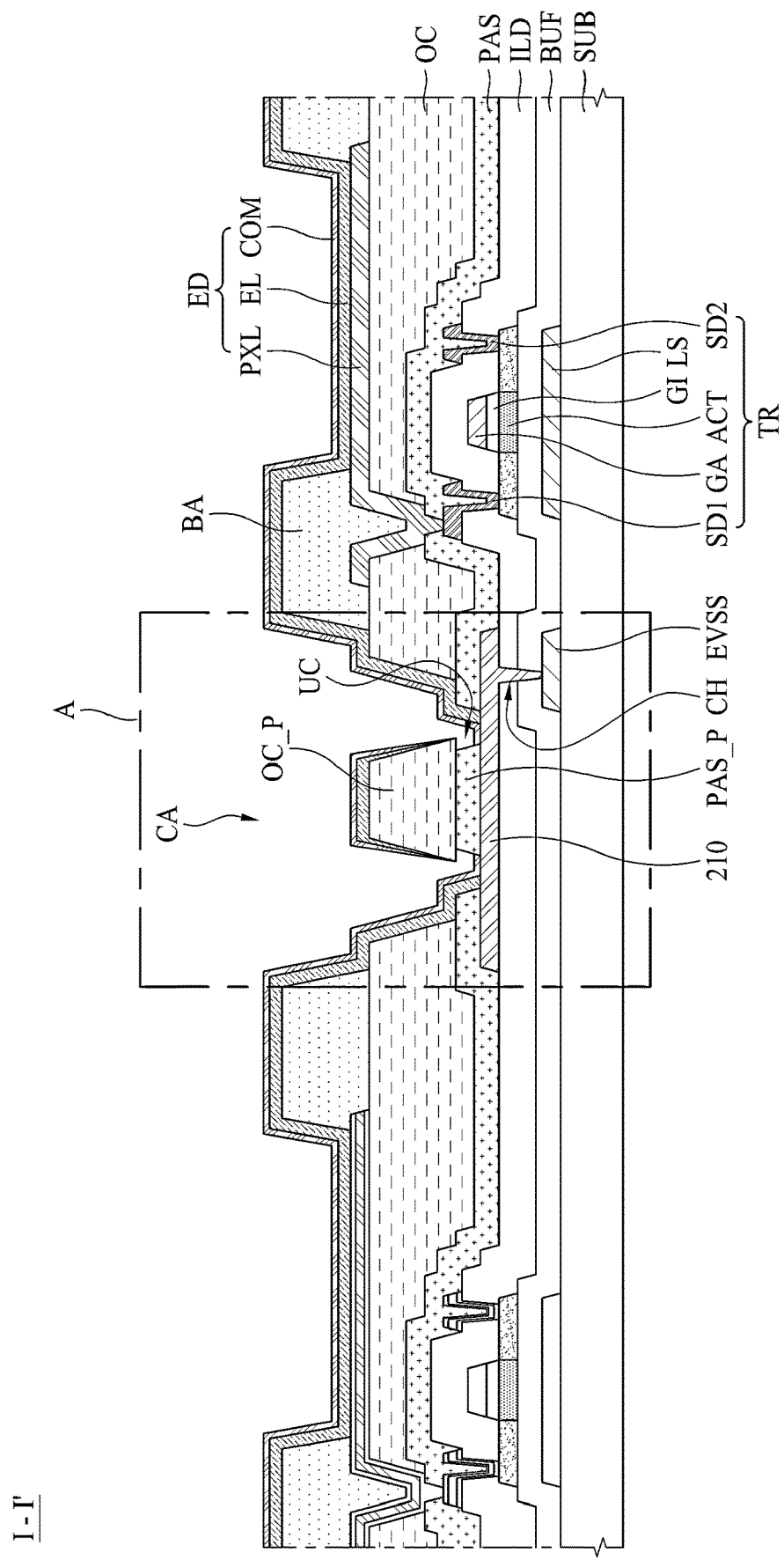
FIG. 3 is a cross sectional view illustrating the light emitting display device according to one example embodiment of the present disclosure along I-I' of FIG. 2.

FIG. 3 is a cross sectional view illustrating the light emitting display device according to the example embodiment of the present disclosure along I-I' of FIG. 2.

Referring to FIG. 3, the light emitting display device 100 according to the example embodiment of the present disclosure may include a substrate SUB, a light shielding layer LS, an auxiliary power line EVSS (second power line or common power line), a buffer layer BUF, a thin film transistor TR, a storage capacitor, a gate insulating film GI, an interlayer insulating film ILD, an auxiliary power electrode 210, a passivation layer PAS (or second protective layer), an overcoat layer OC (first protective layer or planarization layer), a light emitting element ED, a bank layer BA, a contact portion CA, and an undercut structure OC_P and PAS_P.

The substrate SUB is a base substrate and may be formed of a glass or plastic material. For example, the substrate SUB may be formed of a plastic material such as polyimide PI, polyethylene terephthalate PET, polyethylene naphthalate PEN, and/or polycarbonate PC, and may have a flexible characteristic.

A circuit element including various signal lines, a thin film transistor TR, a storage capacitor, and the like may be formed for each of the plurality of subpixels SP1, SP2, SP3, and SP4. The signal lines may include a gate line GL, a data line DL, a first power line EVDD (driving power line or pixel power line), a second power line EVSS (auxiliary power line or common power line), a reference line, and the like, and the thin film transistor TR may include a driving thin film transistor, a switching thin film transistor, a sensing thin film transistor, and the like.

The light shielding layer LS and the auxiliary power line EVSS (second power line or common power line) may be disposed on the substrate SUB. The light shielding layer LS may be disposed to overlap the thin film transistor TR. For example, the light shielding layer LS may overlap an active layer ACT of the thin film transistor TR, and more particularly, a channel region of the active layer ACT on a plane. The light shielding layer LS may serve to block external light from entering the active layer ACT. In addition, the auxiliary power line EVSS (second power line or common power line) may serve to apply a low voltage to a common electrode COM (cathode electrode or second electrode). Furthermore, the auxiliary power line EVSS together with the auxiliary power electrode 210 may serve to lower a resistance of the common electrode COM.

The light shielding layer LS and the auxiliary power line EVSS may be provided in the same layer and may be formed of the same material. In this case, the light shielding layer LS and the auxiliary power line EVSS may be simultaneously formed using the same process.

A buffer layer BUF may be disposed on the substrate SUB and may be configured to cover the light shielding layer LS and the auxiliary power line EVSS. The buffer layer BUF may be formed in a single-layered structure of a multi-layered structure by stacking a plurality of inorganic films. For example, the buffer layer BUF may be formed of a single layer formed of a silicon oxide film SiOx, a silicon nitride film SiNx, and/or a silicon oxynitride film SiOxNy. Alternatively, the buffer layer BUF may be formed of a multilayer in which at least two films of a silicon oxide film SiOx, a silicon nitride film SiNx, and a silicon oxynitride film SiOxNy are stacked. The buffer layer BUF may be formed on the entire upper surface of the substrate SUB to block ions or impurities diffused from the substrate SUB, and to block moisture penetrating into the light emitting element ED through the substrate SUB.

The thin film transistor TR, the storage capacitor, and the auxiliary power electrode 210 may be disposed on the buffer layer BUF. The thin film transistor TR may be disposed in each of the plurality of subpixels SP1, SP2, SP3, and SP4 on the buffer layer BUF. For example, the thin film transistor TR may include an active layer ACT, a gate electrode GA which overlaps the active layer ACT with the gate insulating film GI interposed therebetween, a first source/drain electrode SD1, and a second source/drain electrode SD2. In addition, the storage capacitor may be formed in a three-layered structure by overlapping a first capacitor electrode which uses a portion or the entirety of the light shielding layer LS or auxiliary power line EVSS, a second capacitor electrode which is patterned with the same metal material as the gate electrode GA of the thin film transistor TR, and a third capacitor electrode which uses a portion or the entirety of the auxiliary power electrode 210, but not necessarily limited thereto. If needed, the storage capacitor may be formed of a plurality of layers in various ways. In addition, the auxiliary power electrode 210 may be electrically connected to the auxiliary power line EVSS through a contact hole CH passing through the buffer layer BUF and the interlayer insulating film ILD.

The active layer ACT of the thin film transistor TR may be formed of a silicon-based or oxide-based semiconductor material and may be provided on the buffer layer BUF. The active layer ACT may include a channel region overlapped with the gate electrode GA and a source/drain region connected to the first and second source/drain electrodes SD1 and SD2.

The gate insulating film GI may be formed on the active layer ACT. The gate insulating film GI may be disposed on the channel region of the active layer ACT, and may insulate the active layer ACT and the gate electrode GA. The gate insulating film GI may be formed of an inorganic insulating material, for example, a silicon oxide film SiOx, a silicon nitride film SiNx, a silicon oxynitride film SiOxNy, or a multilayer formed of some or all of the foregoing.

The gate electrode GA may be formed on the gate insulating film GI. The gate electrode GA may be disposed to face the active layer ACT with the gate insulating film GI interposed therebetween. The gate electrode GA may be formed of a single layer or multiple layers selected from a group consisting of copper Cu, molybdenum Mo, aluminum Al, chromium Cr, gold Au, titanium Ti, nickel Ni, neodymium Nd, tantalum Ta, or tungsten W, or an alloy of one or more of the foregoing. In addition, the second capacitor electrode included in the storage capacitor may be formed of the same material as the gate electrode GA. In this case, the gate electrode GA of the thin film transistor TR and the second capacitor electrode of the storage capacitor may be simultaneously formed using the same process.

The interlayer insulating film ILD covering the gate electrode GA may be formed on the buffer layer BUF. Furthermore, the interlayer insulating film ILD may be formed to cover the second capacitor electrode of the storage capacitor. The interlayer insulating film ILD may serve to protect the thin film transistor TR. The interlayer insulating film ILD may be formed of an inorganic insulating material. For example, the interlayer insulating film ILD may be formed of a silicon oxide film SiOx, a silicon nitride film SiNx, a silicon oxynitride layer SiOxNy, or a multilayer of some or all of the foregoing.

The first and second source/drain electrodes SD1 and SD2 may be formed on the interlayer insulating film ILD. Some of the interlayer insulating film ILD may be removed to contact the active layer ACT and the first and second source/drain electrodes SD1 and SD2. For example, the first and second source/drain electrodes SD1 and SD2 may be electrically connected to the active layer ACT through a contact hole passing through the interlayer insulating film ILD.

The auxiliary power electrode 210 may be formed on the interlayer insulating film ILD. A corresponding portion in each of the interlayer insulating film ILD and the buffer layer BUF therebelow may be removed to contact the auxiliary power line EVSS and the auxiliary power electrode 210. For example, the auxiliary power electrode 210 may be electrically connected to the auxiliary power line EVSS through a contact hole CH passing through the interlayer insulating film ILD and the buffer layer BUF. In addition, the auxiliary power electrode 210 may serve as the third capacitor electrode of the storage capacitor.

The first and second source/drain electrodes SD1 and SD2 and the auxiliary power electrode 210 may be provided in the same layer and may be formed of the same material. The first and second source/drain electrodes SD1 and SD2 and the auxiliary power electrode 210 may be simultaneously formed using the same process. The first and second source/drain electrodes SD1 and SD2 and the auxiliary power electrode 210 may be formed as a single layer or multiple layers. When each of the first and second source/drain electrodes SD1 and SD2 and the auxiliary power electrode 210 is formed of a single layer, the first and second source/drain electrodes SD1 and SD2 and the auxiliary power electrode 210 may be formed of any one selected from the group consisting of molybdenum Mo, aluminum Al, chromium Cr, gold Au, titanium Ti, nickel Ni, neodymium Nd, copper Cu, or an alloy of one or more of the foregoing. Furthermore, when each of the first and second source/drain electrodes SD1 and SD2 and the auxiliary power electrode 210 is formed of multilayers, the first and second source/drain electrodes SD1 and SD2 and the auxiliary power electrode 210 may be double layers of molybdenum/aluminum-neodymium, molybdenum/aluminum, titanium/aluminum, or copper/molybdenum titanium. Alternatively, the first and second source/drain electrodes SD1 and SD2 and the auxiliary power electrode 210 may be formed of three layers of molybdenum/aluminum-neodymium/molybdenum, molybdenum/aluminum/molybdenum, titanium/aluminum/titanium, or molybdenum titanium/copper/molybdenum titanium, but not limited thereto. The first and second source/drain electrodes SD1 and SD2 and the auxiliary power electrode 210 may be formed of multiple layers of any one selected from the group consisting of molybdenum Mo, aluminum Al, chromium Cr, gold Au, titanium Ti, nickel Ni, neodymium Nd, copper Cu, or an alloy of one or more of the foregoing.

The thin film transistor TR, the storage capacitor and the auxiliary power electrode 210 disposed on the substrate SUB may constitute a circuit layer (or thin film transistor array layer).

The passivation layer PAS (or second protective layer) may be disposed on the thin film transistor TR and the auxiliary power electrode 210. The passivation layer PAS may be formed to cover the thin film transistor TR and the auxiliary power electrode 210. The passivation layer PAS protects the thin film transistor TR and may be formed of an inorganic insulating material. For example, the passivation layer PAS may include a silicon oxide layer SiOx, a silicon nitride layer SiNx, a silicon oxynitride layer SiOxNy, or may be formed of a multilayer of some or all of the foregoing.

An overcoat layer OC (first protective layer or planarization layer) may be disposed on the passivation layer PAS (or second protective layer). The overcoat layer OC may be formed of an organic insulating material to planarize a step coverage in a lower portion of the overcoat layer OC. For example, the overcoat layer OC may include at least one of organic materials such as photo acryl, polyimide, benzocyclobutene resin, and acrylate-based resin.

A pixel electrode PXL (anode electrode or first electrode) may be disposed on the overcoat layer OC (first protective layer or planarization layer). The pixel electrode PXL may be disposed in each of the plurality of subpixels SP1, SP2, SP3, and SP4 on the overcoat layer OC. The pixel electrode PXL may be connected to the first source/drain electrode SD1 of the thin film transistor TR through a contact hole passing through the overcoat layer OC and the passivation layer PAS. Alternatively, the pixel electrode PXL may be connected to the second source/drain electrode SD2 of the thin film transistor TR. The light emitting layer EL and the common electrode COM may be disposed on the pixel electrode PXL. The pixel electrode PXL, the light emitting layer EL, and the common electrode COM may constitute the light emitting element ED.

The pixel electrode PXL (anode electrode or first electrode) may be formed of metal, an alloy thereof, and/or a combined material of metal and oxide metal. For example, the pixel electrode PXL may have a multi-layered structure including a transparent conductive film and an opaque conductive film having high reflection efficiency. The transparent conductive film of the pixel electrode PXL may be formed of a material having a relatively high work function value such as Indium Tin Oxide ITO or Indium Zinc Oxide IZO, and the opaque conductive film may include one or multiple layers selected from the group consisting of silver Ag, aluminum Al, copper Cu, molybdenum Mo, titanium Ti, nickel Ni, chromium Cr, tungsten W, or an alloy of one or more of the foregoing. For example, the pixel electrode PXL may have a structure in which a transparent conductive film, an opaque conductive film, and a transparent conductive film are sequentially stacked, or a structure in which a transparent conductive film and an opaque conductive film are sequentially stacked.

A bank layer BA may be disposed on the pixel electrode PXL and the overcoat layer OC. The bank layer BA may cover the edge portion of the pixel electrode PXL and define an opening of the subpixel. The bank layer BA may be formed of an organic material such as polyimide, acrylate, benzocyclobutene series resin, or the like. A central portion of the pixel electrode PXL exposed by the bank layer BA may be defined as an emission area. Furthermore, the bank layer BA may define the contact portion CA which exposes a portion of the auxiliary power electrode 210 so that the auxiliary power electrode 210 and the common electrode COM are electrically connected to each other.

The contact portion CA may pass through the passivation layer PAS, the overcoat layer OC, and the bank layer BA, to thereby expose a portion of the auxiliary power electrode 210. An undercut structure OC_P and PAS_P having an undercut region UC may be disposed on the auxiliary power electrode 210 exposed by the contact portion CA.

The undercut structure OC_P and PAS_P may be disposed on a portion of the auxiliary power electrode 210 and may include the undercut region UC. The undercut structure OC_P and PAS_P may be formed in an island pattern on a portion of the auxiliary power electrode 210, and the auxiliary power electrode 210 may be exposed in the periphery of the undercut structure OC_P and PAS_P. The auxiliary power electrode 210, which is exposed in the periphery of the undercut structure OC_P and PAS_P in the contact portion CA, may be in contact with the common electrode COM (cathode electrode or second electrode) and may be electrically connected thereto. In one or more aspects, a portion of the auxiliary power electrode 210, which is exposed at the periphery of the undercut structure OC_P and PAS_P, may be covered by the common electrode COM. The undercut structure OC_P and PAS_P may be formed of the same material as the passivation layer PAS and the overcoat layer OC. The undercut structure OC_P and PAS_P may include a first pattern OC_P (or upper pattern) formed of the same material as the overcoat layer OC and a second pattern PAS_P (or lower pattern) formed of the same material as the passivation layer PAS.

The light emitting layer EL may be disposed on the pixel electrode PXL and the bank layer BA. The light emitting layer EL may be disposed on the overcoat layer OC. Furthermore, the light emitting layer EL may be disposed on the first pattern OC_P of the undercut structure OC_P and PAS_P. The light emitting layer EL may be disposed on a portion of the auxiliary power electrode 210 exposed through the contact portion CA. The light emitting layer EL may be disconnectedly provided in the undercut region UC by the undercut structure positioned in the contact portion CA. For example, the light emitting layer EL may be formed of a material having inferior step coverage. Accordingly, the light emitting layer EL may have a minimized area disposed on the auxiliary power electrode 210 due to the undercut structure OC_P and PAS_P, and the light emitting layer EL is disconnectedly provided in the undercut region UC of the undercut structure OC_P and PAS_P, whereby the auxiliary power electrode 210 disposed thereunder may be exposed.

The common electrode COM (cathode electrode or second electrode) may be disposed on the light emitting layer EL. The common electrode COM may be disposed on the light emitting layer EL of the first pattern OC_P of the undercut structure. The common electrode COM may be disposed on the pixel electrode PXL and the light emitting layer EL, to thereby form the light emitting element ED. The common electrode COM may be widely provided on the entire surface of the substrate SUB. The common electrode COM may be formed of a transparent conductive material such as Indium Tin Oxide ITO or Indium Zinc Oxide IZO, and may be formed of silver Ag, aluminum Al, magnesium Mg, calcium Ca, or an alloy of one or more of the foregoing, which is sufficiently thin to transmit light.

The common electrode COM may be in contact with the auxiliary power electrode 210 exposed by the contact portion CA and may be electrically connected to the auxiliary power electrode 210. The common electrode COM may be disposed to cover the bank layer BA and may be disposed on the auxiliary power electrode 210 in the undercut region UC of the undercut structure OC_P and PAS_P. For example, the common electrode COM may be formed of a material having superior step coverage. The common electrode COM may have a better step coverage than the light emitting layer EL formed by the evaporation, whereby the light emitting layer EL may be disconnectedly provided in the undercut region UC of the undercut structure OC_P and PAS_P and may be formed on the auxiliary power electrode 210 exposed to the external environment. Accordingly, although the light emitting layer EL is not in contact with the auxiliary power electrode 210 in the undercut region UC of the undercut structure OC_P and PAS_P and the auxiliary power electrode 210 is formed to be exposed, the common electrode COM may be disposed on the upper surface of the auxiliary power electrode 210 exposed without being covered by the light emitting layer EL, and may be electrically connected to the auxiliary power electrode 210 in direct contact with the auxiliary power electrode 210.

Figure 4A:
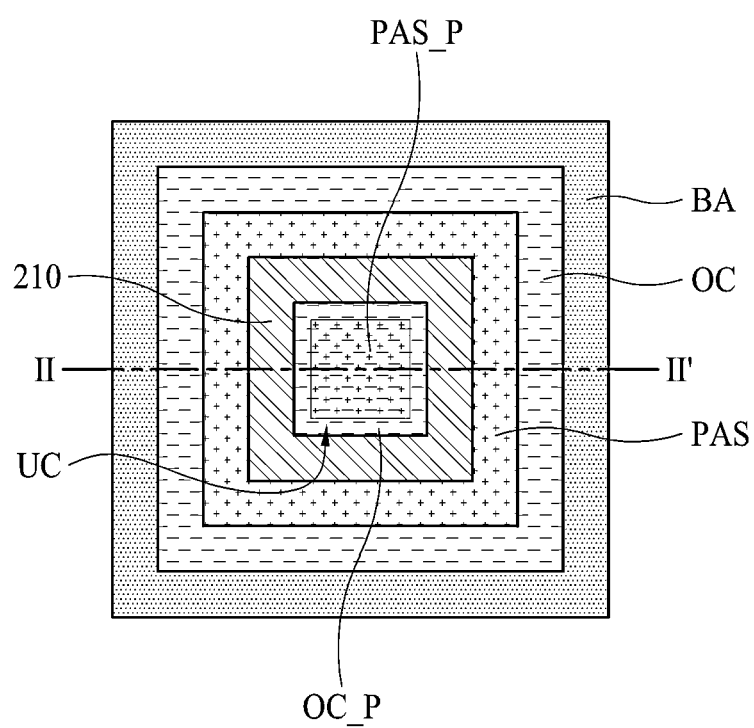
FIG. 4A is a plan view illustrating a contact area shown in 'A' of FIG. 3 according to one example embodiment of the present disclosure.
Figure 4B:
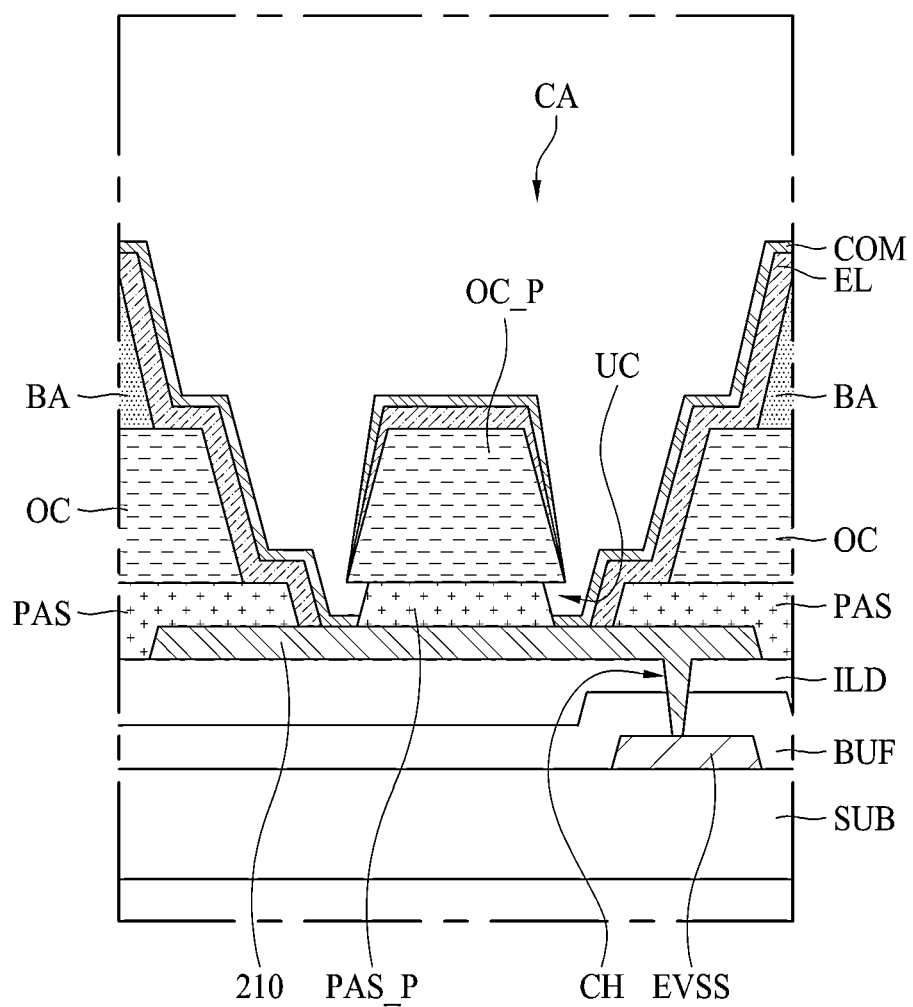
FIG. 4B is an example of a cross sectional view along II-II' of FIG. 4A.

FIG. 4A is a plan view illustrating a contact area shown in 'A' of FIG. 3 according to one example embodiment of the present disclosure. FIG. 4B is an example of a cross sectional view along II-II' of FIG. 4A.

Referring to FIGS. 4A and 4B in connection with FIG. 3, the contact area of the light emitting display device 100 according to one example embodiment of the present disclosure may include the contact portion CA which exposes a portion of the auxiliary power electrode 210. The contact portion CA penetrates through the passivation layer PAS (or second protective layer), the overcoat layer OC (or first protective layer), and the bank layer BA to expose a portion of the auxiliary power electrode 210. The undercut structure OC_P and PAS_P including the first pattern OC_P and the second pattern PAS_P may be disposed on the auxiliary power electrode 210 exposed by the contact portion CA.

The undercut structure OC_P and PAS_P may be disposed on a portion of the auxiliary power electrode 210 and may include the undercut region UC. The undercut structure OC_P and PAS_P may be formed in an island pattern on a portion of the auxiliary power electrode 210, and the exposed portion of the auxiliary power electrode 210 may be formed along the periphery of the undercut structure OC_P and PAS_P. The auxiliary power electrode 210, which is exposed along the periphery of the undercut structure OC_P and PAS_P in the contact portion CA, may be in contact with the common electrode COM (cathode electrode or second electrode) and may be electrically connected thereto. The undercut structure OC_P and PAS_P may be formed of the same material as the passivation layer PAS and the overcoat layer OC. The undercut structure OC_P and PAS_P may include the first pattern OC_P (or upper pattern) formed of the same material as the overcoat layer OC and the second pattern PAS_P (or lower pattern) formed of the same material as the passivation layer PAS.

The first pattern OC_P of the undercut structure OC_P and PAS_P may be formed of an organic insulating material, and the second pattern PAS_P may be formed of an inorganic insulating material. The first pattern OC_P may be formed of the same material as the overcoat layer OC. The first pattern OC_P and the overcoat layer OC may be simultaneously formed using the same process. The second pattern PAS_P may be provided in the same layer as the passivation layer PAS and may be formed of the same material as the passivation layer PAS. The second pattern PAS_P and the passivation layer PAS may be simultaneously formed using the same process. However, the present disclosure is not limited thereto.

The first pattern OC_P may be disposed on a portion of the auxiliary power electrode 210. The first pattern OC_P may be formed of an island pattern on the auxiliary power electrode 210, and the undercut region UC may be formed under the edge of the first pattern OC_P. The first pattern OC_P may be disposed on the second pattern PAS_P and may be overlapped with a portion of the exposed auxiliary power electrode 210.

The second pattern PAS_P may be overlapped with the first pattern OC_P on the top surface (or the upper surface) of the auxiliary power electrode 210 and may be configured to support the first pattern OC_P. The second pattern PAS_P may be formed in an island pattern on the auxiliary power electrode 210 and may include an upper surface which has a first width and is in contact with the first pattern OC_P, a lower surface which has a second width wider than the first width and is in contact with the auxiliary power electrode 210, and an inclined surface between the upper surface and the lower surface. In this case, the width of the lower surface of the first pattern OC_P may be greater than the first width of the upper surface of the second pattern PAS_P. Furthermore, the width of the first pattern OC_P may be equal to or greater than the second width of the lower surface of the second pattern PAS_P. Since the lower surface of the first pattern OC_P has a greater width than the upper surface of the second pattern PAS_P, the undercut region UC may be formed below the edge of the first pattern OC_P. The undercut region UC may include a portion under of the edge of the first pattern OC_P and a side surface of the second pattern PAS_P.

The second pattern PAS_P may be formed by etching a portion of the passivation layer PAS and exposing a portion of the auxiliary power electrode 210 to the periphery of the first pattern OC_P. The second pattern PAS_P may be over-etched in the area overlapped with (or overlapping) the edge of the first pattern OC_P so that the second pattern PAS_P (or an upper portion or an upper edge of the second pattern PAS_P) may be inwardly provided in comparison to the edge (or a lower edge or a lower portion) of the first pattern OC_P, to thereby form the undercut region UC.

As illustrated in FIGS. 4A and 4B, the undercut structure OC_P and PAS_P according to one example embodiment of the present disclosure may have the undercut region UC formed under the edge of the first pattern OC_P. The undercut region UC may be formed by patterning the second pattern PAS_P corresponding to the edge of the first pattern OC_P to be inwardly provided in comparison to the edge of the first pattern OC_P. The undercut region UC may include a portion under the edge of the first pattern OC_P and a side surface of the second pattern PAS_P.

The light emitting layer EL may be formed on the undercut structure OC_P and PAS_P. The light emitting layer EL may be formed on a portion of the exposed region of the auxiliary power electrode 210 along the step coverage of the passivation layer PAS, the overcoat layer OC and the bank layer BA in or at the periphery of the contact portion CA. The light emitting layer EL may not be disposed on the auxiliary power electrode 210 corresponding to the undercut region UC in the exposed region of the auxiliary power electrode 210. Since the light emitting layer EL is formed of a material having inferior step coverage, the light emitting layer is not formed in the auxiliary power electrode 210 of the undercut region UC and is disconnectedly provided therein, whereby the light emitting layer EL may have a minimized area disposed on the exposed region of the auxiliary power electrode 210.

The common electrode COM may be formed on the light emitting layer EL. The common electrode COM may be formed on the light emitting layer EL of the undercut structure OC_P and PAS_P and the common electrode may be formed on the emission layer EL along the step coverage among the passivation layer PAS, the overcoat layer OC, and the bank layer BA in or at the periphery of the contact portion CA. Furthermore, the common electrode COM may be disposed on the upper surface of the auxiliary power electrode 210 exposed without being covered by the light emitting layer EL and may be electrically connected to the auxiliary power electrode 210 in direct contact with the auxiliary power electrode 210. Since the common electrode COM is formed of a material having step coverage superior to (or greater than) that of the light emitting layer EL, the common electrode COM may be formed onto the auxiliary power electrode 210 of the undercut region UC in which the light emitting layer EL is not formed, whereby the common electrode COM may be in direct contact with the auxiliary power electrode 210 and may be electrically connected to the auxiliary power electrode 210. Accordingly, in case of the light emitting display device 100 according to one example embodiment of the present disclosure, even though the auxiliary power electrode 210 overlapped with (or overlapping) the undercut region UC is not covered by the light emitting layer EL, the common electrode COM is in direct contact with the auxiliary power electrode 210 exposed without being covered by the light emitting layer EL and is electrically connected to the auxiliary power electrode 210, thereby reducing non-uniformity of the voltage drop due to the resistance variation of the common electrode COM in the entire display panel.

In the light emitting display device 100 according to one example embodiment of the present disclosure, the light emitting layer EL and the common electrode COM formed on the upper surface of the undercut structure OC_P and PAS_P may be disconnectedly provided along the periphery of the first pattern OC_P of the undercut structure OC_P and PAS_P. In this case, the common electrode COM formed on the undercut structure OC_P and PAS_P may exist in a floating state electrically separated.

Figure 5A:
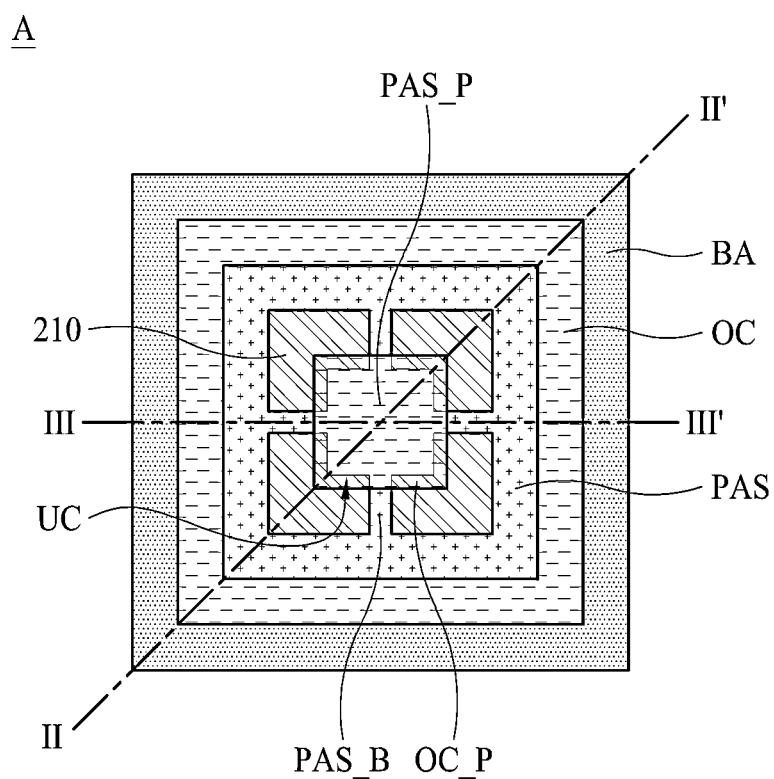
FIG. 5A is a plan view illustrating a contact area shown in 'A' of FIG. 3 according to another example embodiment of the present disclosure.
Figure 5B:
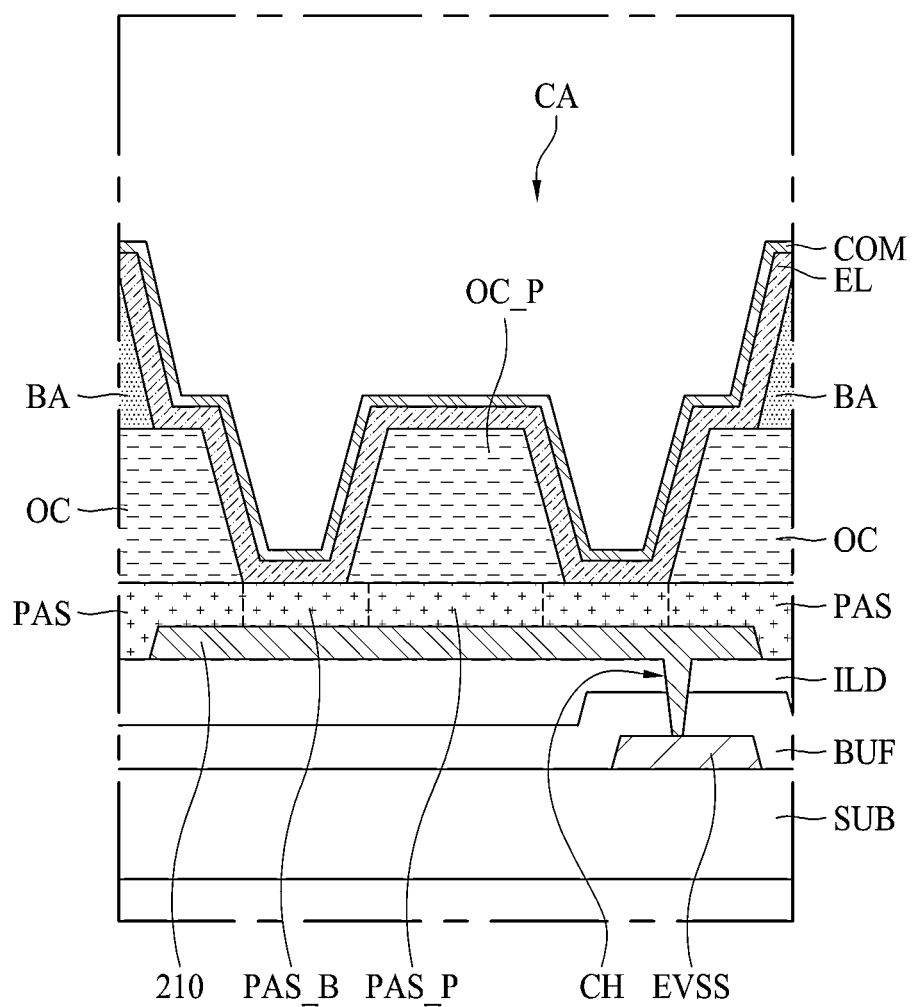
FIG. 5B is an example of a cross sectional view along of FIG. 5A.

FIG. 5A is a plan view illustrating a contact area shown in 'A' of FIG. 3 according to another example embodiment of the present disclosure. FIG. 5B is an example of a cross sectional view along of FIG. 5A. In FIG. 5A, a cross-sectional view along II-II' is substantially the same as that of FIG. 4B, and a cross-sectional view along is substantially the same as that of FIG. 5B.

Referring to FIGS. 5A and 5B in connection with FIG. 3, the contact area of the light emitting display device 100 according to another example embodiment of the present disclosure may include a contact portion CA which exposes a portion of an auxiliary power electrode 210. The contact portion CA penetrates through a passivation layer PAS (or second protective layer), an overcoat layer OC (or first protective layer), and a bank layer BA to expose a portion of the auxiliary power electrode 210. An undercut structure OC_P, PAS_P and PAS_B including a first pattern OC_P, a second pattern PAS_P and a third pattern PAS_B may be disposed on the auxiliary power electrode 210 exposed by the contact portion CA.

The undercut structure OC_P, PAS_P and PAS_B may be disposed on a portion of the auxiliary power electrode 210 and may partially include an undercut region UC. The undercut structure OC_P, PAS_P and PAS_B is disposed on a portion of the auxiliary power electrode 210, and an exposed portion of the auxiliary power electrode 210 may be formed along a portion of the periphery of the undercut structure OC_P, PAS_P and PAS_B. The auxiliary power electrode 210, which is exposed along a portion of the periphery of the undercut structure OC_P, PAS_P and PAS_B in the contact portion CA, may be in contact with a common electrode COM (cathode electrode or second electrode) and may be electrically connected thereto. The undercut structure OC_P, PAS_P and PAS_B may be formed of the same material as the passivation layer PAS and the overcoat layer OC. The undercut structure OC_P, PAS_P and PAS_B may include the first pattern OC_P (or upper pattern) formed of the same material as the overcoat layer OC, the second pattern PAS_P (or lower pattern) formed of the same material as the passivation layer PAS, and the third pattern PAS_B (or bridge pattern) formed of the same material as the passivation layer PAS.

The first pattern OC_P of the undercut structure OC_P, PAS_P and PAS_B may be formed of an organic insulating material, and the second pattern PAS_P and the third pattern PAS_B may be formed of an inorganic insulating material. The first pattern OC_P may be formed of the same material as the overcoat layer OC. The first pattern OC_P and the overcoat layer OC may be simultaneously formed using the same process. The second pattern PAS_P and the third pattern PAS_B may be provided in the same layer as the passivation layer PAS and may be formed of the same material as the passivation layer PAS. The second and third patterns PAS_P and PAS_B and the passivation layer PAS may be simultaneously formed using the same process. However, the present disclosure is not limited thereto.

The first pattern OC_P may be disposed on a portion of the auxiliary power electrode 210. The first pattern OC_P may be formed in an island pattern on the auxiliary power electrode 210, and the undercut region UC may be formed in a portion below the edge of the first pattern OC_P. The first pattern OC_P may be disposed on the second pattern PAS_P and the third pattern PAS_B and may be overlapped with a portion of the exposed auxiliary power electrode 210.

The second pattern PAS_P may be formed on the upper surface of the auxiliary power electrode 210 and may be overlapped with (or may overlap) the first pattern OC_P, to thereby support the first pattern OC_P. The third pattern PAS_B may be formed on the upper surface of the auxiliary power electrode 210 and may be partially overlapped with the first pattern OC_P, and a portion of the third pattern PAS_B overlapped with the first pattern OC_P may be connected to the second pattern PAS_P.

The second pattern PAS_P and the third pattern PAS_B may be formed in a lattice shape overlapped with at least a portion of the first pattern OC_P on a plane. The second pattern PAS_P may be disposed in the center of the lattice shape, and the third pattern PAS_B may be extended from the second pattern PAS_P, disposed in the center of the lattice shape, in a cross shape (or "+" shape). The second pattern PAS_P may be overlapped with the first pattern OC_P, may correspond to the shape of the first pattern OC_P, and may have a size smaller than that of the first pattern OC_P. The third pattern PAS_B may be disposed between the second pattern PAS_P and the passivation layer PAS around the undercut structure OC_P, PAS_P and PAS_B, and may be integrally formed with the second pattern PAS_P and the peripheral passivation layer PAS. The third pattern PAS_B may be formed to connect a portion of the second pattern PAS_P and a portion of the peripheral passivation layer PAS. The third pattern PAS_B may be formed in a linear shape connecting the second pattern PAS_P to the peripheral passivation PAS. For example, the second pattern PAS_P may have at least one side surface, and the third pattern PAS_B may be extended from at least one side surface of the second pattern PAS_P. The third pattern PAS_B may be extended toward the adjacent passivation layer PAS with the second pattern PAS_P interposed therebetween. For example, as illustrated in FIG. 5A, the second pattern PAS_P may have a rectangular shape having four side surfaces, and the third pattern PAS_B may be formed in a straight-line shape extending from the center of each of the four side surfaces of the second pattern PAS_P to the adjacent passivation layer PAS, but not limited thereto.

The second pattern PAS_P may include an upper surface having a first width and contacting the first pattern OC_P, a lower surface having a second width wider than the first width and contacting the auxiliary power electrode 210, and an inclined surface between the upper surface and the lower surface. The third pattern PAS_B may extend to both sides with the second pattern PAS_P interposed therebetween. The third pattern PAS_B may be in contact with the lower surface of the first pattern OC_P and may have the same height of the second pattern PAS_P. In this case, the width of the lower surface of the first pattern OC_P may be greater than the first width of the upper surface of the second pattern PAS_P and may have a width equal to or greater than the second width of the lower surface of the second pattern PAS_P. In addition, the lower surface of the first pattern OC_P may be in contact with the upper surface of the third pattern PAS_B.

Since the lower surface of the first pattern OC_P has a width wider than the upper surface of the second pattern PAS_P and at least a portion thereof is in contact with the third pattern PAS_B, the undercut region UC may be formed below some edge of the first pattern OC_P. That is, the undercut region UC may be formed under the remaining edges of the first pattern OC_P except for the portion overlapped with the third pattern PAS_B. The undercut region UC may include a portion under some edge of the first pattern OC_P and a side surface of the second pattern PAS_P, except for a portion in which the third pattern PAS_B is disposed.

The second pattern PAS_P and the third pattern PAS_B may be formed by etching the passivation layer PAS overlapped with the first pattern OC_P so as to expose a portion of the auxiliary power electrode 210 in the periphery of the first pattern OC_P. The second pattern PAS_P may be over-etched in the area overlapped with the edge of the first pattern OC_P so that the second pattern PAS_P may be inwardly provided in comparison to the edge of the first pattern OC_P, to thereby form the undercut region UC. The third pattern PAS_B may be formed by the remaining portion of the passivation layer PAS_P extending in at least both sides with the second pattern PAS_P interposed therebetween without any etching. Accordingly, the undercut region UC may be formed under the remaining edges of the first pattern OC_P except for the portion overlapped with the third pattern PAS_B.

As illustrated in FIGS. 5A and 4B, the undercut structure OC_P, PAS_P and PAS_B according to another example embodiment of the present disclosure may have the undercut region UC formed under some edge of the first pattern OC_P. The undercut region UC may be formed by patterning the second pattern PAS_P corresponding to the edge of the first pattern OC_P to be more inwardly positioned than the edge of the first pattern OC_P. In addition, as illustrated in FIGS. 5A and 5B, the undercut structure OC_P, PAS_P, and PAS_B may have the third pattern PAS_B overlapped with some edge of the first pattern OC_P. The third pattern PAS_B may be formed to connect the second pattern PAS_P and the passivation layer PAS spaced apart from the second pattern PAS_P with the exposed region of the auxiliary power electrode 210 therebetween. The third pattern PAS_B may be formed by patterning a portion of the passivation layer PAS on the exposed auxiliary power electrode 210 without being removed to be patterned in the straight-line shape connecting the second pattern PAS_P and the peripheral passivation layer PAS. Accordingly, the undercut region UC may include a portion under some edge of the first pattern OC_P and a side surface of the second pattern PAS_P except for the portion in which the third pattern PAS_B is disposed.

The light emitting layer EL may be formed on the undercut structure OC_P, PAS_P and PAS_B, and may be partially formed on the exposed region of the auxiliary power electrode 210 along the step coverage of the passivation layer PAS, the overcoat layer OC and the bank layer BA in or at the periphery of the contact portion CA. The light emitting layer EL may not be disposed on the auxiliary power electrode 210 corresponding to the undercut region UC in the exposed region of the auxiliary power electrode 210. Since the light emitting layer EL is formed of a material having inferior step coverage, the light emitting layer is not formed in the auxiliary power electrode 210 of the undercut region UC and is disconnectedly provided therein, whereby the light emitting layer EL may have a minimized area disposed on the exposed region of the auxiliary power electrode 210. Furthermore, the light emitting layer EL may be continuously provided in the peripheral area of the contact area without the disconnection by the third pattern PAS_B configured to connect the undercut structure OC_P, PAS_P and PAS_B and the peripheral passivation layer PAS.

The common electrode COM may be formed on the light emitting layer EL. The common electrode COM may be formed on the light emitting layer EL of the undercut structure OC_P, PAS_P and PAS_B and the common electrode may be formed on the light emitting layer EL along the step coverage among the passivation layer PAS, the overcoat layer OC, and the bank layer BA in the periphery of the undercut structure OC_P, PAS_P and PAS_B. Furthermore, the common electrode COM may be disposed on the upper surface of the auxiliary power electrode 210 exposed without being covered by the light emitting layer EL and may be electrically connected to the auxiliary power electrode 210 in direct contact with the auxiliary power electrode 210. Since the common electrode COM is formed of a material having step coverage superior to (or greater than) that of the light emitting layer EL, the common electrode COM may be formed onto the auxiliary power electrode 210 of the undercut region UC in which the light emitting layer EL is not formed, whereby the common electrode COM may be in direct contact with the auxiliary power electrode 210 and may be electrically connected to the auxiliary power electrode 210. In addition, the common electrode COM may be continuously connected to the periphery of the contact area without being disconnected through the third pattern PAS_B configured to connect the undercut structure OC_P, PAS_P and PAS_B and the peripheral passivation layer PAS. Accordingly, in case of the light emitting display device 100 according to another example embodiment of the present disclosure, even though the auxiliary power electrode 210 overlapped with the undercut region UC is not covered by the light emitting layer EL, the common electrode COM is in direct contact with the auxiliary power electrode 210 exposed without being covered by the light emitting layer EL and is electrically connected to the auxiliary power electrode 210, thereby reducing non-uniformity of the voltage drop due to the resistance variation of the common electrode COM in the entire display panel.

In the light emitting display device 100 according to another example embodiment of the present disclosure, the contact area and the peripheral area may be continuously provided without disconnection through the third pattern PAS_B connecting the undercut structure OC_P, PAS_P and PAS_B and the peripheral passivation layer PAS. Accordingly, the common electrode COM on the undercut structure OC_P, PAS_P and PAS_B may be electrically connected to prevent static electricity from being generated.

Hereinafter, a method of manufacturing the light emitting display device according to the example embodiment of the present disclosure is described in more detail with reference to FIGS. 6A to 9C.

Figure 6A:
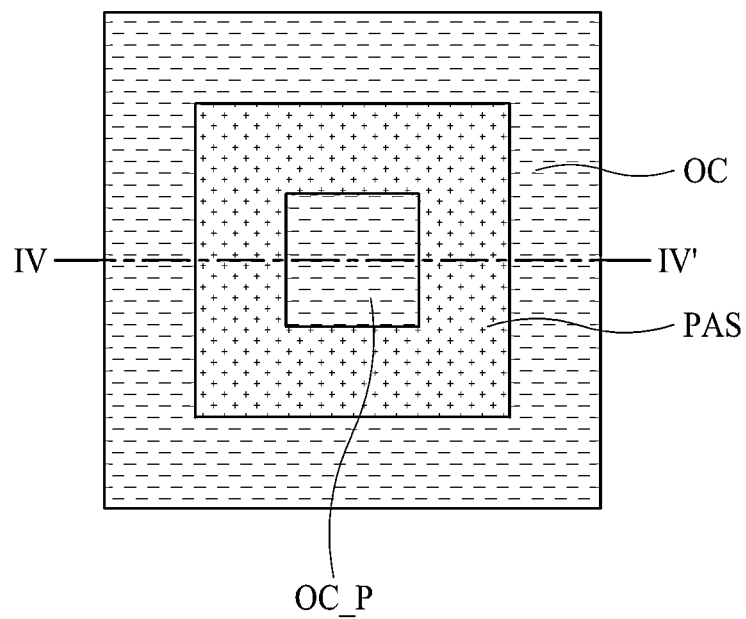
FIG. 6A is a plan view illustrating a process of manufacturing the light emitting display device according to the example embodiment of the present disclosure.
Figure 6B:
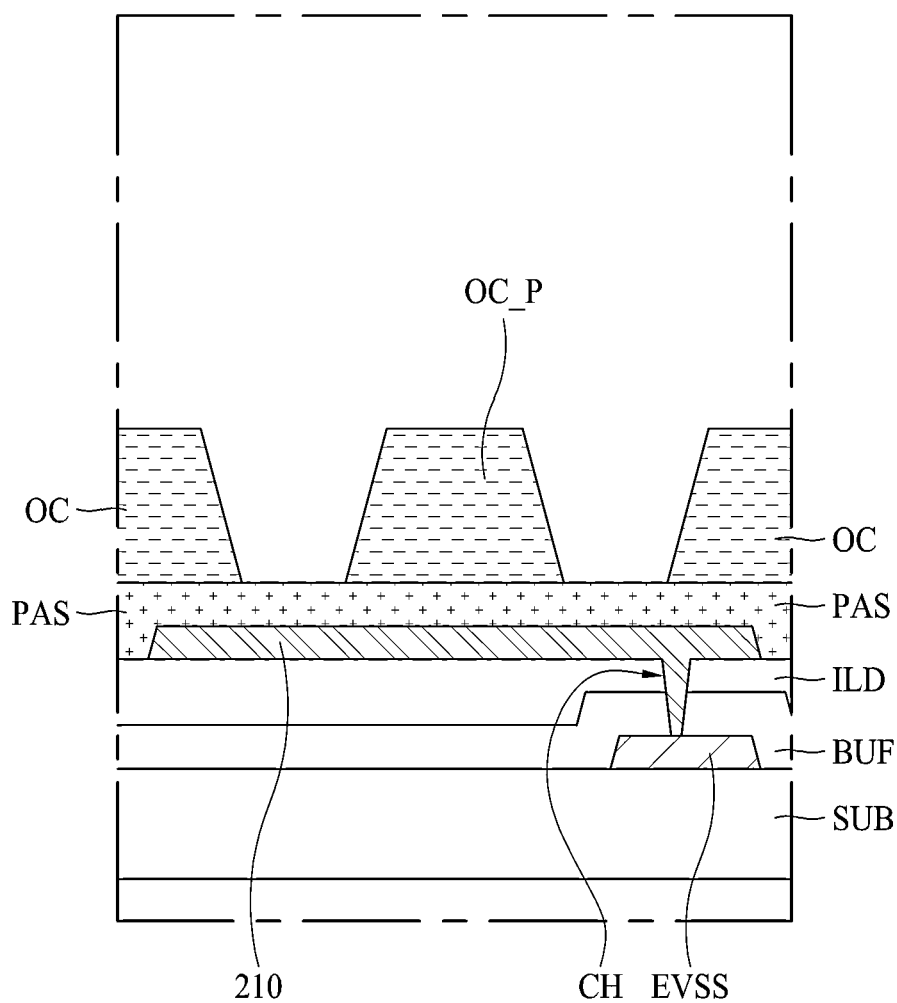
FIG. 6B is an example of a cross sectional view along IV-IV' of FIG. 6A.
Figure 7A:
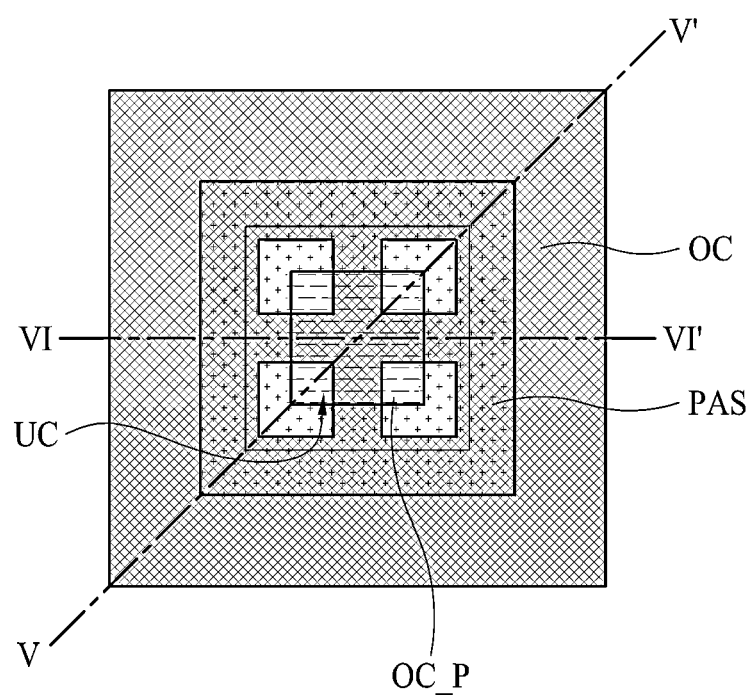
FIG. 7A is a plan view illustrating a process of manufacturing the light emitting display device according to the example embodiment of the present disclosure.
Figure 7B:
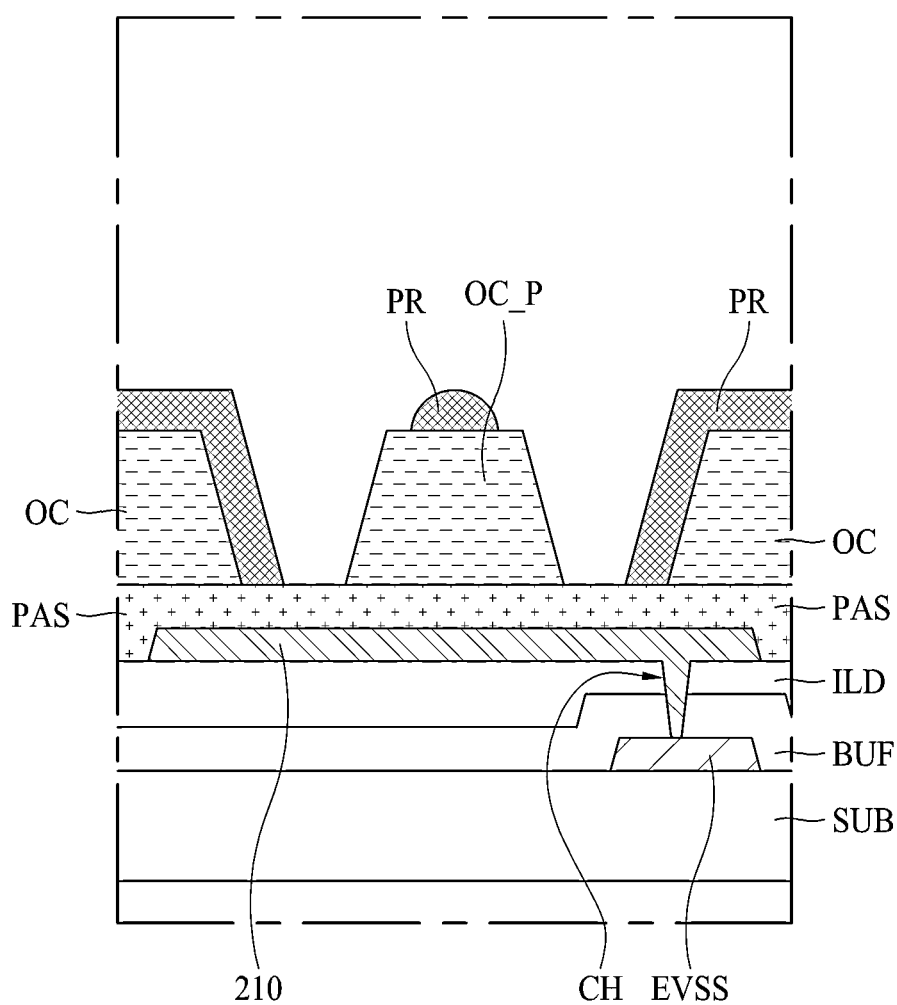
FIG. 7B is an example of a cross sectional view along V-V' of FIG. 7A.
Figure 7C:
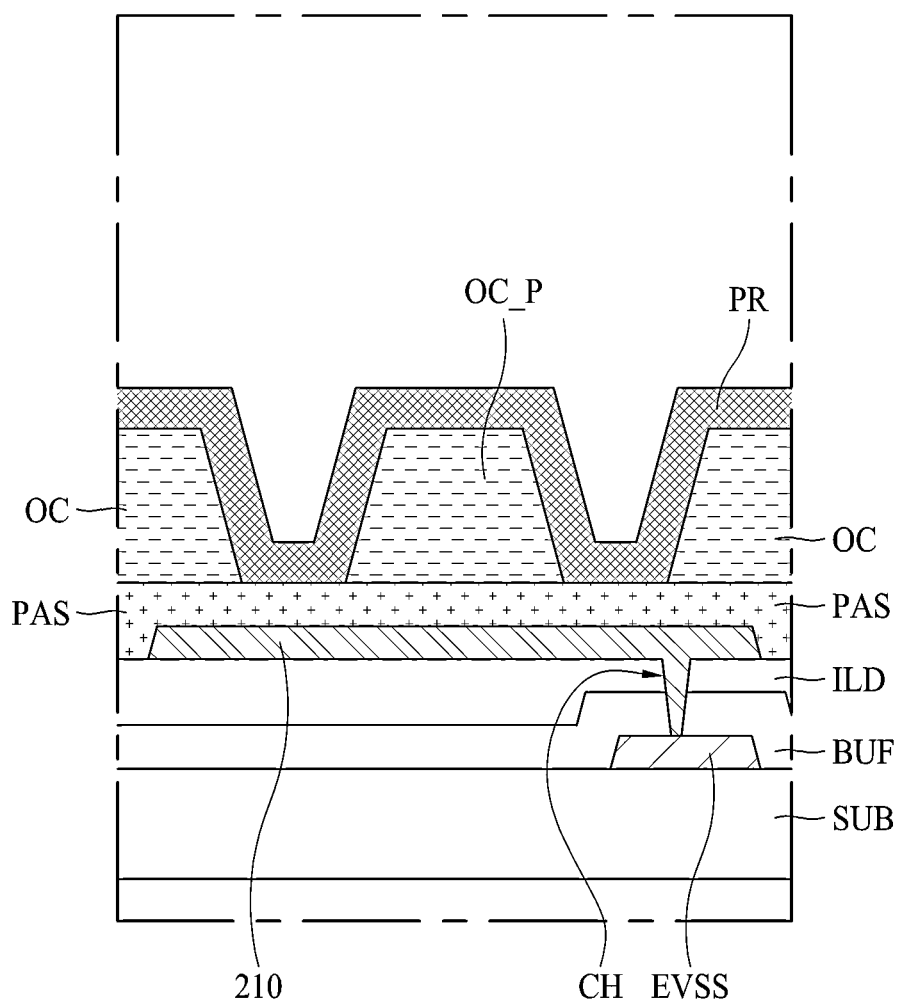
FIG. 7C is a cross sectional view along VI-VI' of FIG. 7A.
Figure 8A:
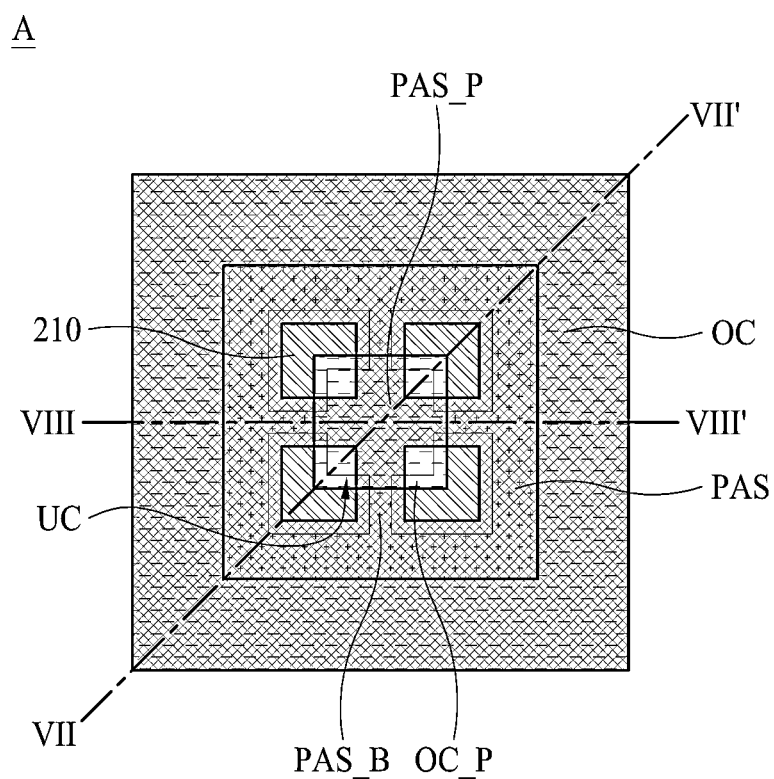
FIG. 8A is a plan view illustrating a process of manufacturing the light emitting display device according to the example embodiment of the present disclosure.
Figure 8B:
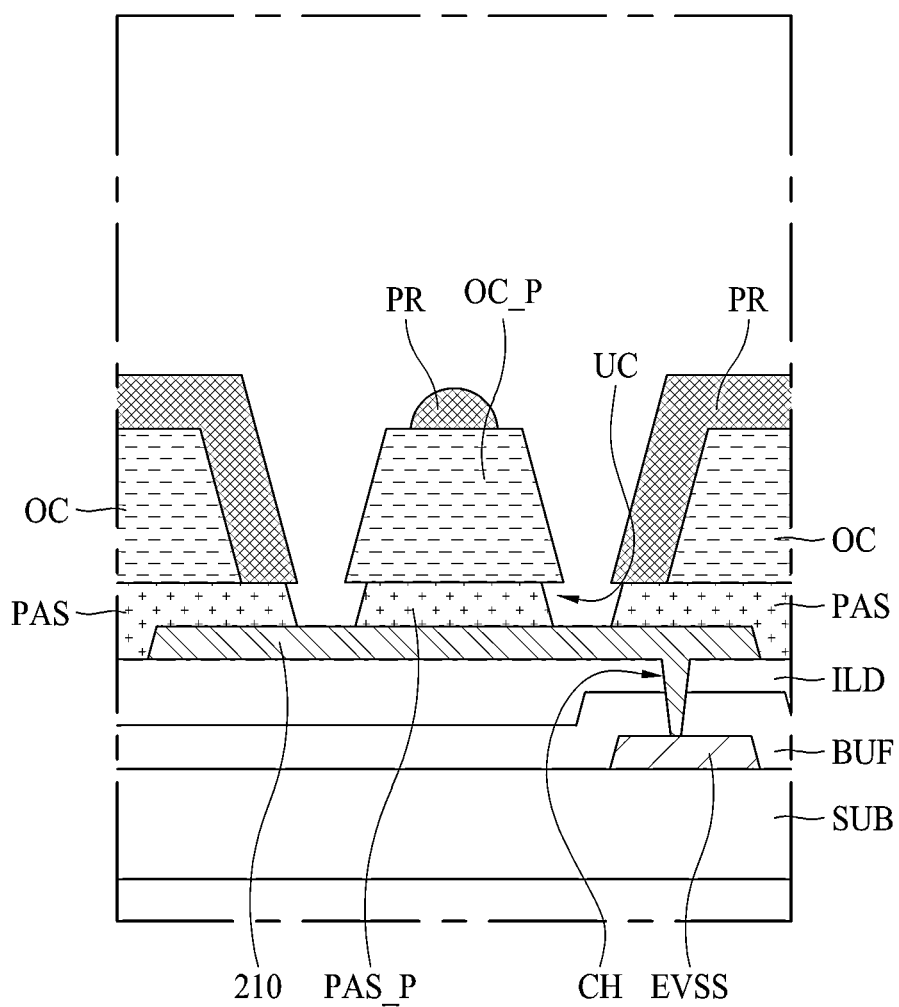
FIG. 8B is an example of a cross sectional view along VII-VII' of FIG. 8A.
Figure 8C:
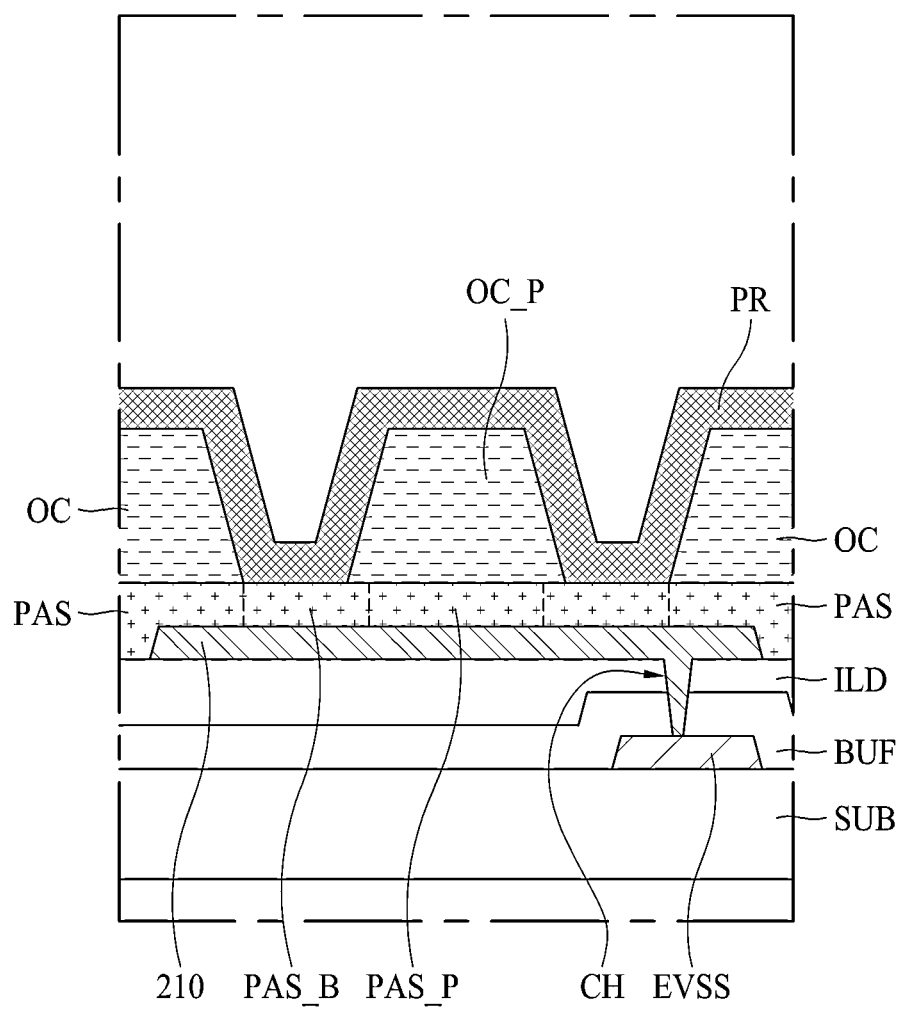
FIG. 8C is an example of a cross sectional view along VIII-VIII' of FIG. 8A.
Figure 9A:
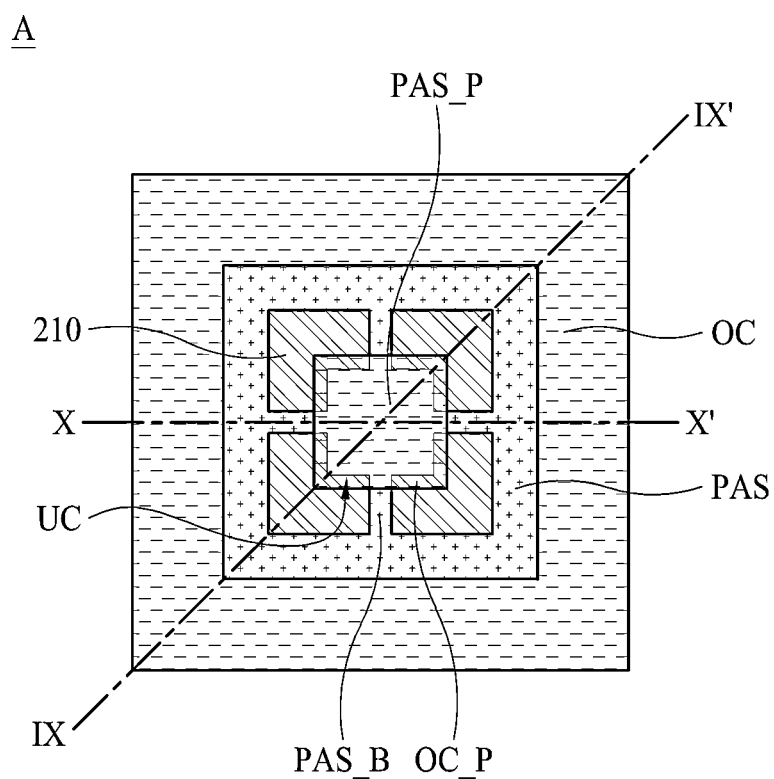
FIG. 9A is a plan view illustrating a process of manufacturing the light emitting display device according to the example embodiment of the present disclosure.
Figure 9B:
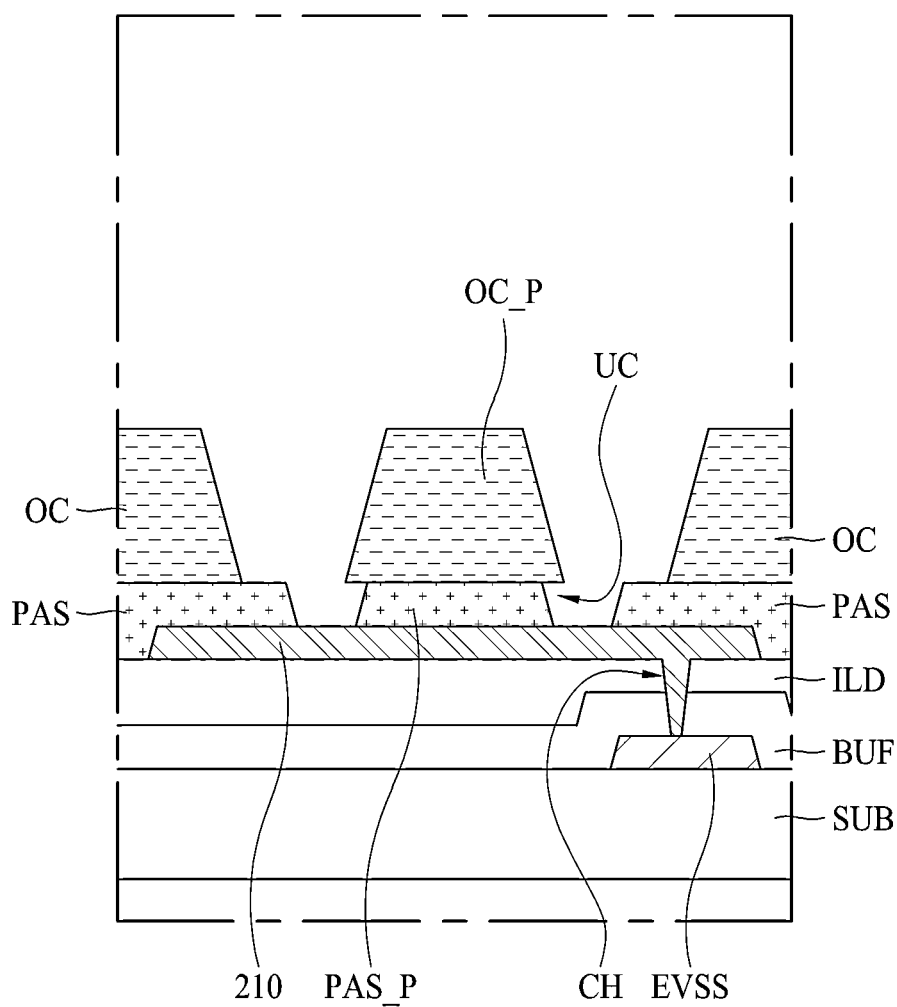
FIG. 9B is an example of a cross sectional view along IX-IX' of FIG. 9A.
Figure 9C:
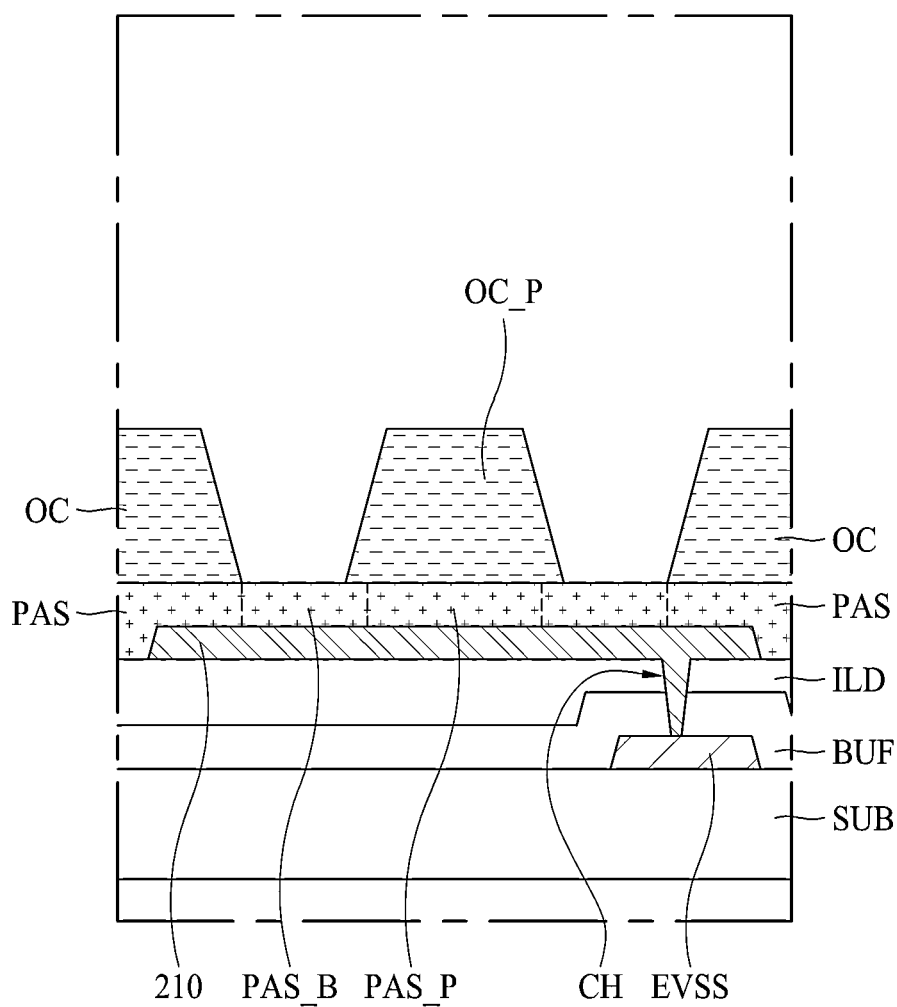
FIG. 9C is an example of a cross sectional view along X-X' of FIG. 9A.

FIGS. 6A, 7A, 8A and 9A are plan views illustrating a method of manufacturing the light emitting display device according to the example embodiment of the present disclosure, FIG. 6B is an example of a cross sectional views along IV-IV' of FIG. 6A, FIG. 7B is an example of a cross sectional view along V-V' of FIG. 7A, FIG. 7C is an example of a cross sectional view along VI-VI' of FIG. 7A, FIG. 8B is an example of a cross sectional view along line VII-VII' of FIG. 8A, FIG. 8C is an example of a cross sectional view along VIII-VIII' of FIG. 8A, FIG. 9B is an example of a cross sectional view along line IX-IX' of FIG. 9A, and FIG. 9C is an example of a cross sectional view along X-X' of FIG. 9A. This relates to a method of manufacturing the light emitting display device according to one example embodiment of the present disclosure shown in FIGS. 4A and 4B, or a method of manufacturing the light emitting display device according to another example embodiment of the present disclosure shown in FIGS. 5A and 5B, whereby the same reference numerals will be used throughout the drawings to refer to the same components, and a redundant description thereof may be omitted or simplified for brevity.

As illustrated in FIGS. 6A and 6B, the overcoat layer OC may be patterned on the passivation layer PAS. The overcoat layer OC may be patterned to expose a portion of the passivation layer PAS overlapped with the auxiliary power electrode 210. The first pattern OC_P of the undercut structure may be patterned at the center of the exposed region of the passivation layer PAS.

The first pattern OC_P may be formed in an island pattern at the center of the exposed region of the passivation layer PAS, and the overcoat layer OC may be patterned in the periphery of the first pattern OC_P with the exposed region of the passivation layer PAS interposed therebetween. After the subsequent process, a portion of the auxiliary power electrode 210 may be exposed by removing the passivation layer PAS exposed between the first pattern OC_P and the peripheral overcoat layer OC.

As illustrated in FIGS. 7A to 7C, after the overcoat layer OC is patterned, a photoresist pattern PR may be formed thereon. The photoresist pattern PR may be formed in a lattice shape with respect to the center of the first pattern OC_P on a plane. The photoresist pattern PR may have a cross shape (or "+" shape) with respect to the center of the first pattern OC_P. The exposed region of the passivation layer PAS may be formed by masking the remaining portions of the photoresist pattern PR except for a portion corresponding to an opening of the lattice shape of the photoresist pattern PR. Furthermore, the first pattern OC_P may be disposed at the center of the cross shape of the photoresist pattern PR, to thereby mask the passivation layer PAS overlapped with the first pattern OC_P.

As illustrated in FIG. 7B, the photoresist pattern PR may be exposed without covering the passivation layer PAS in the opening of the lattice shape.

As shown in FIG. 7C, the photoresist pattern PR is not exposed by covering the passivation layer PAS on the cross shape.

Meanwhile, in the light emitting display device according to one example embodiment of the present disclosure illustrated in FIGS. 4A and 4B, the contact portion CA including the undercut structure OC_P and PAS_P may be formed by using the first pattern OC_P and the overcoat layer OC on the passivation layer PAS as an etch mask pattern without formation of the photoresist pattern PR.

As illustrated in FIGS. 8A to 8C, when the passivation layer PAS under the overcoat layer OC is etched using the photoresist pattern PR and the first pattern OC_P as a mask, the passivation layer PAS which is not masked by the photoresist pattern PR and the first pattern OC_P may be removed, whereby the auxiliary power electrode 210 may be exposed. The passivation layer PAS may be formed by patterning the second pattern PAS_P and the third pattern PAS_B using an etching process.

The passivation layer PAS is over-etched in the area overlapped with the opening of the photoresist pattern PR and the edge of the first pattern OC_P so that the passivation layer PAS may be inwardly provided in comparison to the edge of the first pattern OC_P, to thereby form the second pattern PAS_P having the undercut region UC. Furthermore, the passivation layer PAS may be inwardly provided in comparison to the edge of the opening of the photoresist pattern PR, to thereby form the third pattern PAS_B.

As illustrated in FIG. 8B, the passivation layer PAS may be patterned with the second pattern PAS_P overlapped with the first pattern OC_P, and the second pattern PAS_P may be provided inwardly in comparison to the edge of the first pattern OC_P which is not covered by the photoresist pattern PR, to thereby form the undercut region UC.

As illustrated in FIG. 8C, the passivation layer PAS may be patterned with the third pattern PAS_B overlapped with the first pattern OC_P and the photoresist pattern PR, the third pattern PAS_B may be in contact with the lower surface of the first pattern OC_P and may have the same height as that of the second pattern PAS_P, and the third pattern PAS_B is configured to connect the second pattern PAS_P and the peripheral passivation layer PAS with each other, to thereby form the undercut region UC.

As illustrated in FIGS. 9A to 9C, after etching the passivation layer PAS, the photoresist pattern PR is removed so that it is possible to form the exposed region of the auxiliary power electrode 210 and to form the undercut structure OC_P, PAS_P and PAS_B.

The undercut structure OC_P, PAS_P and PAS_B may be disposed on a portion of the auxiliary power electrode 210, and the exposed region of the auxiliary power electrode 210 may be formed on a portion in the periphery of the undercut structure OC_P, PAS_P and PAS_B.

The first pattern OC_P of the undercut structure OC_P, PAS_P and PAS_B may be formed in an island pattern on a portion of the auxiliary power electrode 210, and the undercut region UC may be formed in a portion below the edge.

The second pattern PAS_P and the third pattern PAS_B of the undercut structure OC_P, PAS_P and PAS_B may be formed in a lattice shape overlapping at least a portion of the first pattern OC_P on a plane. The second pattern PAS_P may be disposed at the center of the lattice shape, and the third pattern PAS_B may be extended from the second pattern PAS_P disposed at the center of the lattice shape to the cross shape (or "+" shape).

As illustrated in FIG. 9B, the undercut region UC may be formed below a portion of the edge of the first pattern OC_P of the undercut structure OC_P, PAS_P and PAS_B.

As illustrated in FIG. 9C, the third pattern PAS_B of the undercut structure OC_P, PAS_P and PAS_B is in contact with the lower surface of the first pattern OC_P and may have the same height as that of the second pattern PAS_P, and the third pattern PAS_B is configured to connect the second pattern PAS_P and the peripheral passivation layer PAS with each other, whereby the undercut region UC may not be formed.

A light emitting display device and a method of manufacturing a light emitting display device according to one or more example embodiments of the present disclosure may be described as follows without limiting the subject technology.

A light emitting display device according to one or more example embodiments of the present disclosure may include a circuit layer having an auxiliary power electrode disposed on a substrate, a protective layer covering the circuit layer, a contact portion exposing a portion of the auxiliary power electrode, and an undercut structure disposed on a portion of the auxiliary power electrode and configured to include an undercut region. The undercut region may be formed at at least a portion of a periphery of the undercut structure.

In the light emitting display device according to one or more example embodiments of the present disclosure, the undercut structure may include a first pattern disposed on a portion of the auxiliary power electrode, and a second pattern disposed on an upper surface of the auxiliary power electrode and configured to support the first pattern. The undercut region may be formed under at least a portion of an edge of the first pattern.

In the light emitting display device according to one or more example embodiments of the present disclosure, the at least a portion of the edge of the first pattern may be overlapped with at least a portion of an exposed region of the auxiliary power electrode.

In the light emitting display device according to one or more example embodiments of the present disclosure, the undercut structure may include at least one of an organic insulating material and an inorganic insulating material.

In the light emitting display device according to one or more example embodiments of the present disclosure, the first pattern may be formed of an organic insulating material, and the second pattern may be formed of an inorganic insulating material.

In the light emitting display device according to one or more example embodiments of the present disclosure, the first pattern may be formed in an island pattern, and the contact portion may be provided with an exposed region of the auxiliary power electrode at at least a portion of a periphery of the first pattern.

In the light emitting display device according to one or more example embodiments of the present disclosure, the undercut region may include a portion under at least a portion of the edge of the first pattern and a side surface of the second pattern.

In the light emitting display device according to one or more example embodiments of the present disclosure, the undercut structure may further include a third pattern disposed on the upper surface of the auxiliary power electrode, partially overlapped with the first pattern and extended from the second pattern.

In the light emitting display device according to one or more example embodiments of the present disclosure, the undercut region may be formed under the remaining portions of the edge of the first pattern except for a portion overlapped with the third pattern.

In the light emitting display device according to one or more example embodiments of the present disclosure, the third pattern may be extended to at least both sides with the second pattern interposed therebetween.

In the light emitting display device according to one or more example embodiments of the present disclosure, the second pattern and the third pattern may be formed in a lattice shape overlapped with at least a portion of the first pattern on a plane.

In the light emitting display device according to one or more example embodiments of the present disclosure, the second pattern may be disposed at a center of the lattice shape, and the third pattern may be extended from the second pattern, disposed at the center of the lattice shape, in a cross shape.

In the light emitting display device according to one or more example embodiments of the present disclosure, a lower surface of the first pattern may be in contact with an upper surface of the third pattern, and the second pattern and the third pattern have the same height.

In the light emitting display device according to one or more example embodiments of the present disclosure, the protective layer may include a first protective layer formed of an organic insulating material, and a second protective layer disposed between the first protective layer and the auxiliary power electrode and formed of an inorganic insulating material.

In the light emitting display device according to one or more example embodiments of the present disclosure, the undercut structure may include a first pattern provided in the same layer as the first protective layer and formed of the same material as the first protective layer, and a second pattern provided in the same layer as the second protective layer and formed of the same material as the second protective layer. The contact portion may be provided with an exposed region of the auxiliary power electrode between the second pattern and the second protective layer at at least a portion of a periphery of the first pattern.

In the light emitting display device according to one or more example embodiments of the present disclosure, the undercut region may include at least a portion of an edge of the first pattern and a side surface of the second pattern.

In the light emitting display device according to one or more example embodiments of the present disclosure, the undercut structure may include a third pattern partially overlapped with the first pattern, extended from the second pattern, provided in the same layer as the second pattern and formed of the same material as the second pattern.

In the light emitting display device according to one or more example embodiments of the present disclosure, the third pattern may connect the second pattern and the second protective layer with each other.

In the light emitting display device according to one or more example embodiments of the present disclosure, may further include a thin film transistor disposed on the circuit layer of the substrate, a pixel electrode disposed on the protective layer and connected to the thin film transistor, a light emitting layer disposed on the pixel electrode, and a common electrode disposed on the light emitting layer. The common electrode may directly contact the auxiliary power electrode at the undercut region of the undercut structure.

A method of manufacturing a light emitting display device according to one or more example embodiments of the present disclosure may include forming a circuit layer having an auxiliary power electrode on a substrate, forming a protective layer of at least one of an organic insulating material and an inorganic insulating material so as to cover the circuit layer, and forming an undercut structure having an undercut region on a portion of the auxiliary power electrode so as to expose a portion of the auxiliary power electrode. The undercut region may be formed at at least a portion of the periphery of the undercut structure.

In the method of manufacturing a light emitting display device according to one or more example embodiments of the present disclosure, the step of forming of the undercut structure may include patterning a first protective layer formed of the organic insulating material of the protective layer and patterning a second protective layer formed of the inorganic insulating material of the protective layer in order to form a first pattern of the undercut structure and to expose a portion of the second protective layer at a periphery of the first pattern, forming a photoresist pattern having a lattice shape with respect to a center of the first pattern, and forming second and third patterns of the undercut structure and exposing a portion of the auxiliary power electrode at a periphery of the second and third patterns by etching the second protective layer using the photoresist pattern and the first pattern as a mask. The undercut region may include a portion under an edge of the first pattern except for a portion overlapped with the third pattern. The undercut region may also include a side surface of the second pattern.

In the light emitting display device according to one or more example embodiments of the present disclosure, a cathode electrode on an island-shaped undercut structure may be formed to be electrically connected to each other, thereby uniformly increasing the cathode contact area and preventing a bursting phenomenon from occurring in the cathode contact area by preventing static electricity of the cathode electrode.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A light emitting display device comprising:
   a circuit layer having an auxiliary power electrode disposed on a substrate;
   a protective layer covering the circuit layer;
   a contact region formed in the protective layer; and
   an undercut structure disposed in the contact region,
   wherein the undercut structure includes:
   a first pattern disposed on the auxiliary power electrode, the first pattern being spaced apart and discontinuous from the protective layer;
   a second pattern disposed on an upper surface of the auxiliary power electrode to support the first pattern; and
   a third pattern extending continuously from the second pattern to the protective layer on the upper surface of the auxiliary power electrode,
   wherein an upper surface of the third pattern including a first portion covered the first pattern and a second portion exposed by the first pattern,
   wherein an undercut region is formed under a peripheral portion of the first pattern laterally protruding from the second pattern, and
   wherein a portion of the auxiliary power electrode in the contact region is exposed by the undercut structure.

2. The light emitting display device according to claim 1, wherein the peripheral portion of the first pattern is overlapped with an exposed region of the auxiliary power electrode.

3. The light emitting display device according to claim 1, wherein the undercut structure includes at least one of an organic insulating material and an inorganic insulating material.

4. The light emitting display device according to claim 1,
   wherein the first pattern is formed of an organic insulating material, and
   the second pattern is formed of an inorganic insulating material.

5. The light emitting display device according to claim 1, wherein the first pattern is formed in an island pattern.

6. The light emitting display device according to claim 1, wherein the undercut region is defined by a bottom surface of the peripheral portion of the first pattern and a side surface of the second pattern.

7. The light emitting display device according to claim 1, wherein the undercut region is formed under the peripheral portion of the first pattern except for a portion of the peripheral portion of the first pattern overlapping the third pattern.

8. The light emitting display device according to claim 1, wherein the third pattern extends on two opposing sides of the second pattern.

9. The light emitting display device according to claim 1, wherein the second pattern and the third pattern are formed in a lattice shape.

10. The light emitting display device according to claim 9,
wherein the second pattern is disposed at a center of the lattice shape, and the third pattern is extended from the second pattern in a cross shape.

11. The light emitting display device according to claim 1, wherein a lower surface of the first pattern is in contact with the first portion of the upper surface of the third pattern, and the second pattern and the third pattern have a same height.

12. The light emitting display device according to claim 1,
wherein the protective layer includes:
a first protective layer formed of an organic insulating material; and
a second protective layer disposed between the first protective layer and the auxiliary power electrode and formed of an inorganic insulating material.

13. The light emitting display device according to claim 12,
wherein the first pattern is provided in a same layer as the first protective layer and formed of a same material as the first protective layer,
wherein the second pattern is provided in a same layer as the second protective layer and formed of a same material as the second protective layer, and
wherein the contact region includes an exposed region of the auxiliary power electrode between the second pattern and the second protective layer under the peripheral portion of the first pattern.

14. The light emitting display device according to claim 13,
wherein the undercut region is defined by a bottom surface of the peripheral portion of the first pattern and a side surface of the second pattern.

15. The light emitting display device according to claim 13, wherein the third pattern is provided in a same layer as the second pattern, and formed of a same material as the second pattern.

16. The light emitting display device according to claim 15, wherein the third pattern connects the second pattern and the second protective layer.

17. The light emitting display device according to claim 1, further comprising:
a thin film transistor disposed on the circuit layer of the substrate;
a pixel electrode disposed on the protective layer and connected to the thin film transistor;
a light emitting layer disposed on the pixel electrode; and
a common electrode disposed on the light emitting layer,
wherein the common electrode directly contacts the auxiliary power electrode at the undercut region of the undercut structure.

* * * * *